(12) United States Patent
Kajimoto et al.

(10) Patent No.: US 7,719,106 B2
(45) Date of Patent: *May 18, 2010

(54) SEMICONDUCTOR DEVICE, ELECTRONIC CARD AND PAD REARRANGEMENT SUBSTRATE

(75) Inventors: Minori Kajimoto, Fujisawa (JP); Osamu Ikeda, Yokohama (JP); Masaki Momodomi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

This patent is subject to a terminal disclaimer.

(21) Appl. No.: 11/780,375

(22) Filed: Jul. 19, 2007

(65) Prior Publication Data

US 2008/0012108 A1 Jan. 17, 2008

Related U.S. Application Data

(60) Continuation of application No. 11/005,387, filed on Dec. 6, 2004, now Pat. No. 7,268,424, which is a division of application No. 10/290,028, filed on Nov. 6, 2002, now Pat. No. 7,095,102.

(30) Foreign Application Priority Data

Nov. 7, 2001 (JP) .............................. 2001-342294

(51) Int. Cl.
H01L 23/12 (2006.01)
(52) U.S. Cl. .................................. 257/701; 257/E23.02
(58) Field of Classification Search .................. 257/701, 257/E23.02
See application file for complete search history.

(56) References Cited

U.S. PATENT DOCUMENTS

| 5,917,706 | A | 6/1999 | Steffen ........................ 361/773 |
| 6,211,554 | B1 | 4/2001 | Whitney ...................... 257/355 |
| 6,235,553 | B1 | 5/2001 | Kawan ........................ 438/107 |
| 6,597,061 | B1 | 7/2003 | Wallace ....................... 257/679 |
| 7,095,102 | B2 * | 8/2006 | Kajimoto et al. ............. 257/679 |
| 7,268,424 | B2 * | 9/2007 | Kajimoto et al. ............. 257/701 |
| 2002/0158323 | A1 | 10/2002 | Iwasaki ....................... 257/679 |
| 2003/0141580 | A1 | 7/2003 | Fukunaga ................... 257/679 |

FOREIGN PATENT DOCUMENTS

| JP | 56-157590 | 12/1981 |
| JP | 58-016552 | 1/1983 |
| JP | 03-006858 | 1/1991 |
| JP | 04-365396 | 12/1992 |
| JP | 06-183189 | 7/1994 |
| JP | 08-307087 | 11/1996 |
| JP | 10-198778 | 7/1998 |
| JP | 2000-010687 | 1/2000 |
| JP | 2000-261163 | 9/2000 |
| JP | 2001-144469 | 5/2001 |
| KR | 1998-068706 | 10/1998 |

* cited by examiner

*Primary Examiner*—W. David Coleman
(74) *Attorney, Agent, or Firm*—Hogan & Hartson LLP

(57) ABSTRACT

A semiconductor device comprises a substrate, an external terminal provided on the substrate, an internal wiring pattern electrically connected to the external terminal, a semiconductor chip mounted on the substrate and electrically connected to the internal wiring pattern, and an antenna pattern. The antenna pattern provided at each of adjacent two corner portions of the substrate and is grounded.

10 Claims, 21 Drawing Sheets

| Chip thickness | A | 200 ± 15 |
|---|---|---|
| Paste (tape) thickness | B | 40 ± 20 |
| Substrate thickness | C | 190 ± 20 |
| (Chip substrate thickness) | C' | 170 |
| Cavity thickness | D | 435 ± 20 |
| (Chip cavity thickness) | D' | 450 |
| Package thickness | F | 625 ± 28 |
| Loop height | G | 125 ± 25 |
| Bonding step | H | 250 |
| Resin thickness on wire | J | 75 ± 41 |

($\mu$m)

Land plane

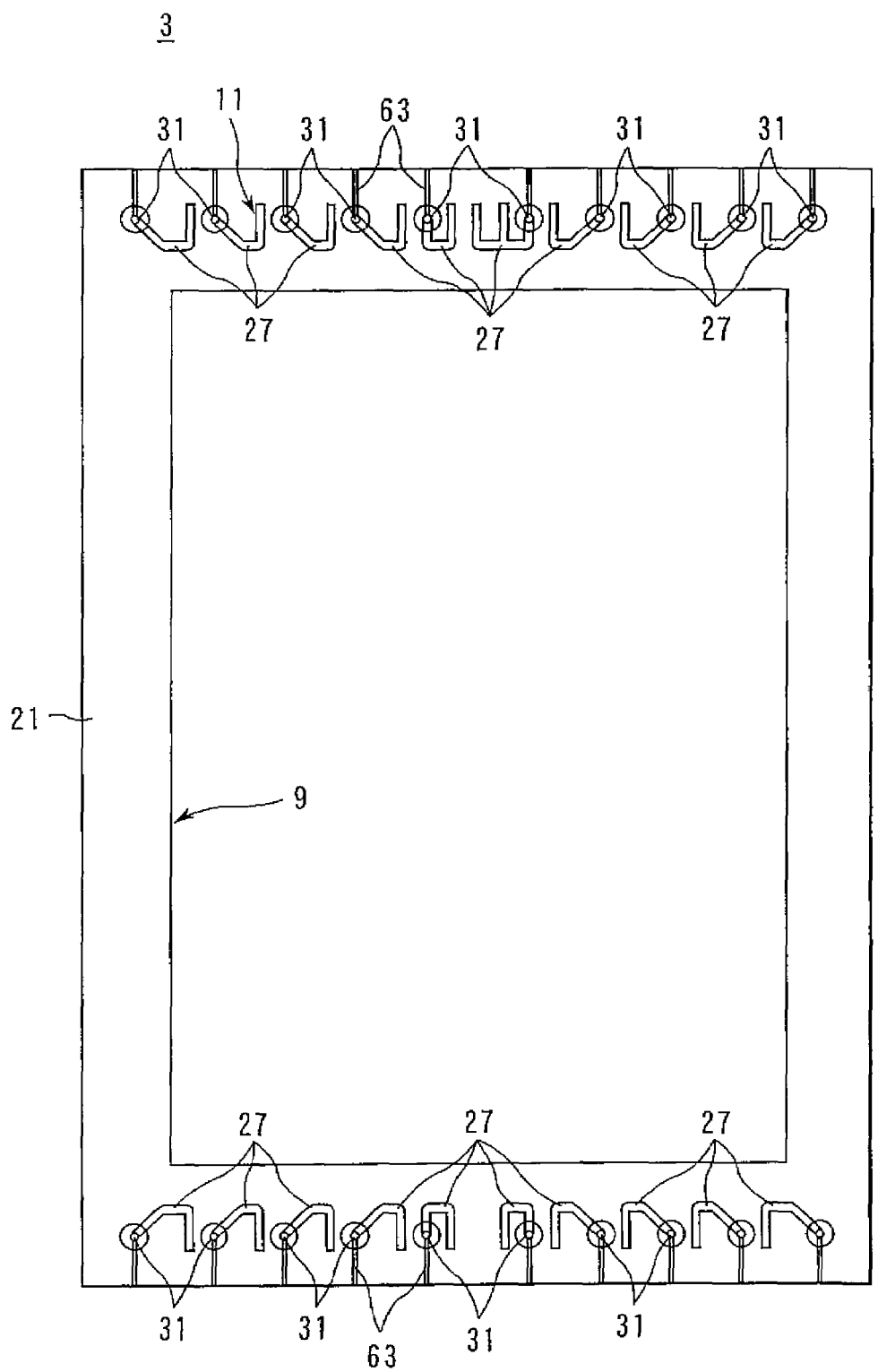
FIG. 5  Bonding plane

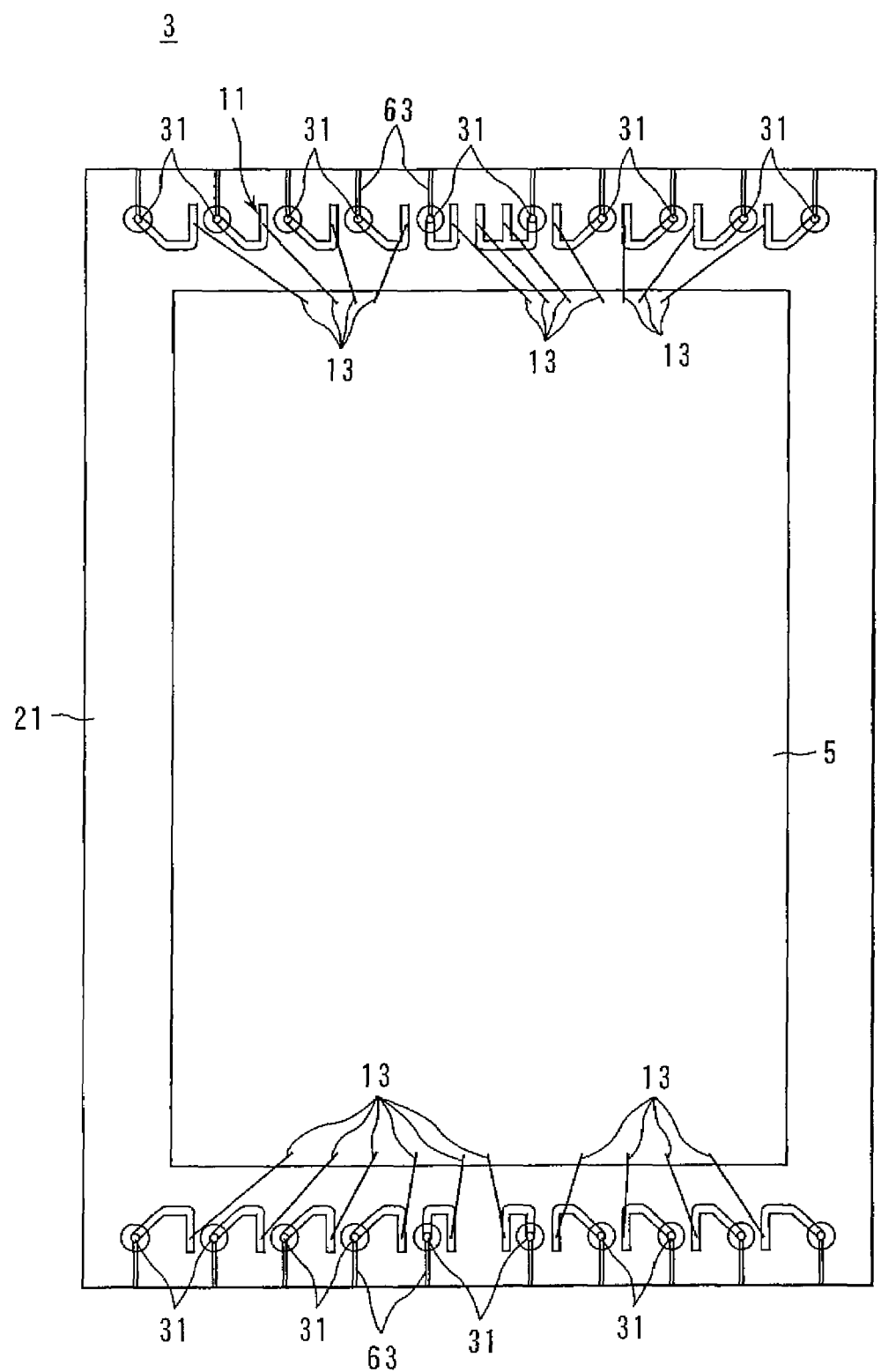
FIG. 6  Bonding plane

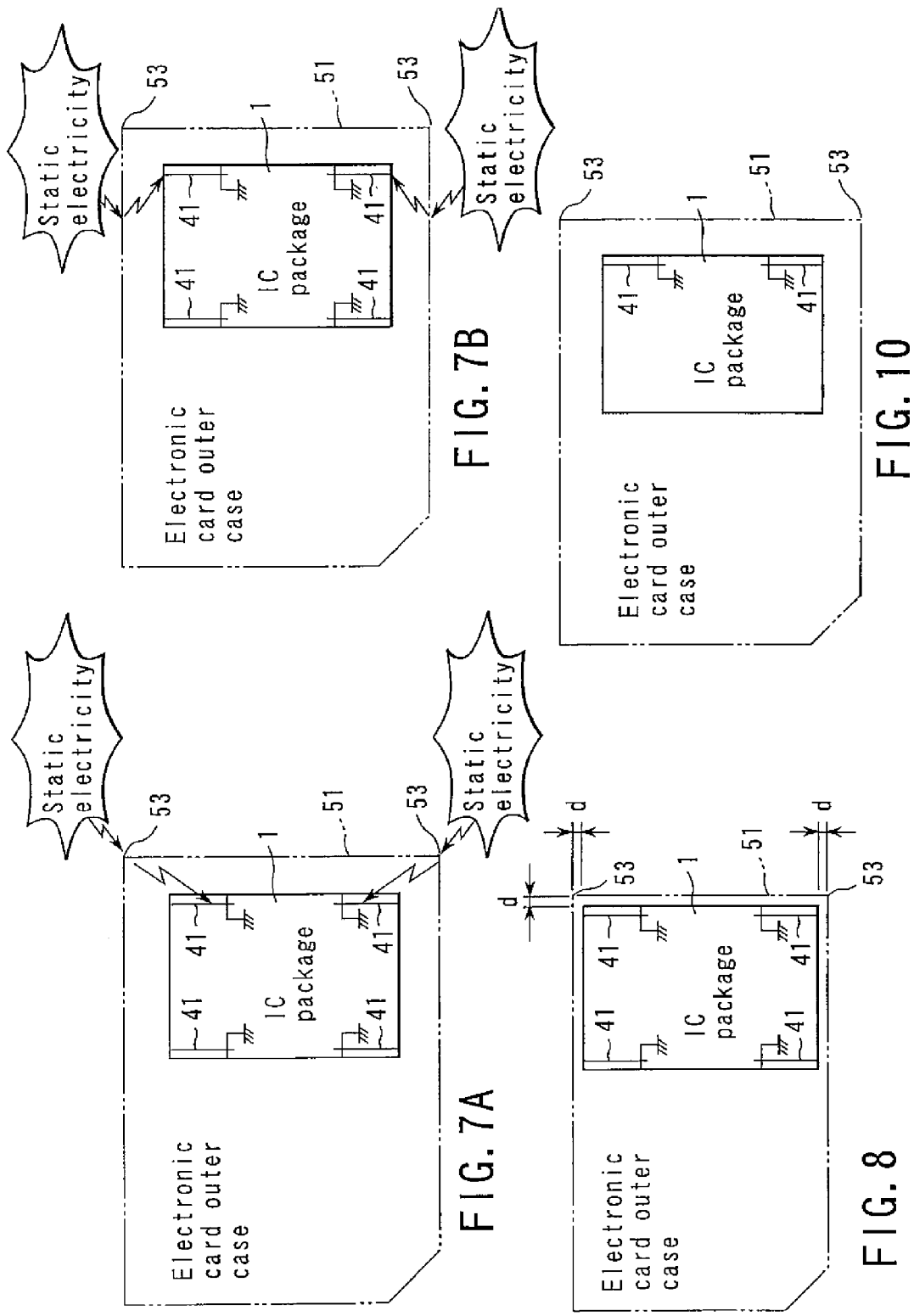

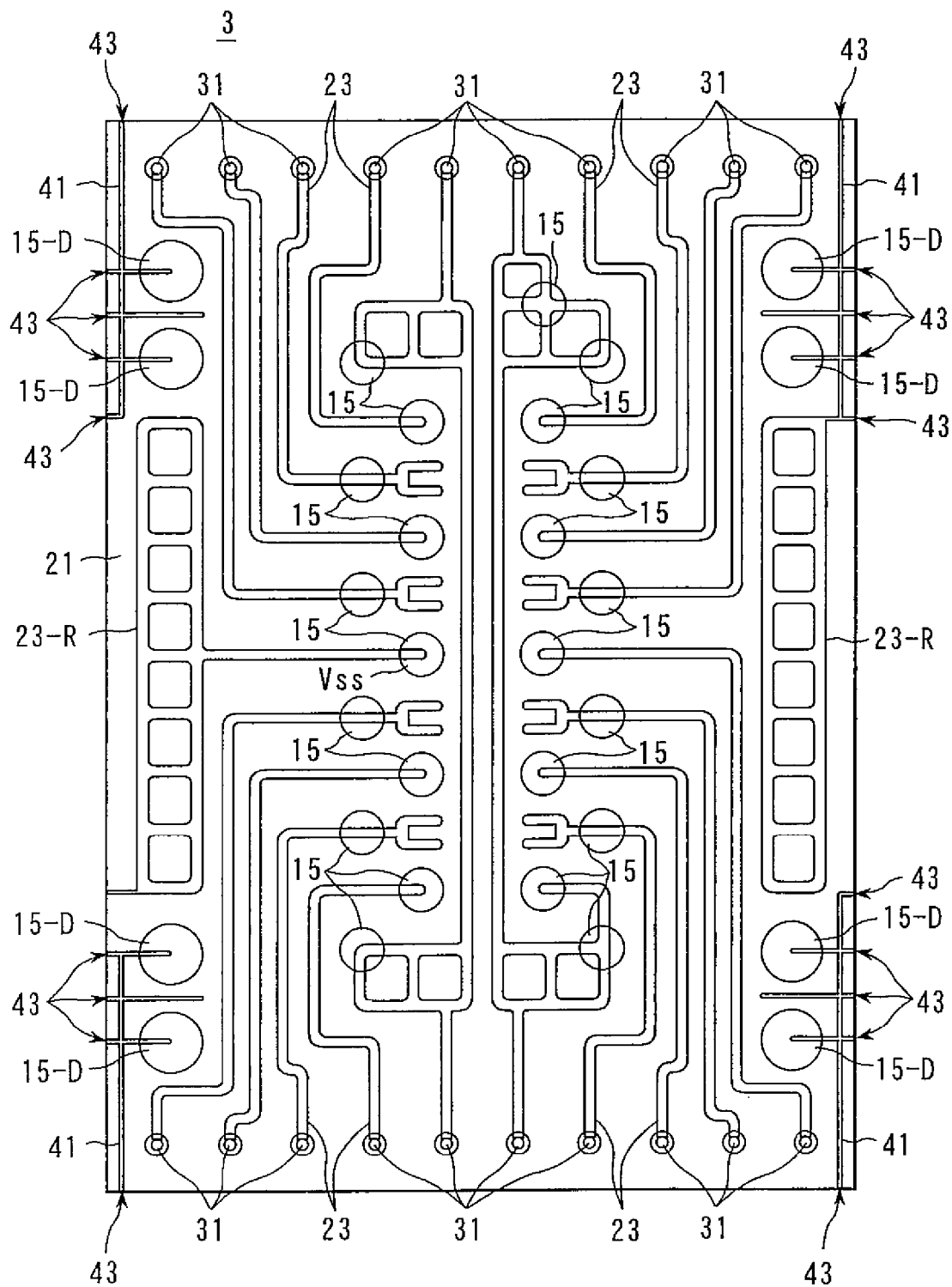
FIG. 12  Land plane

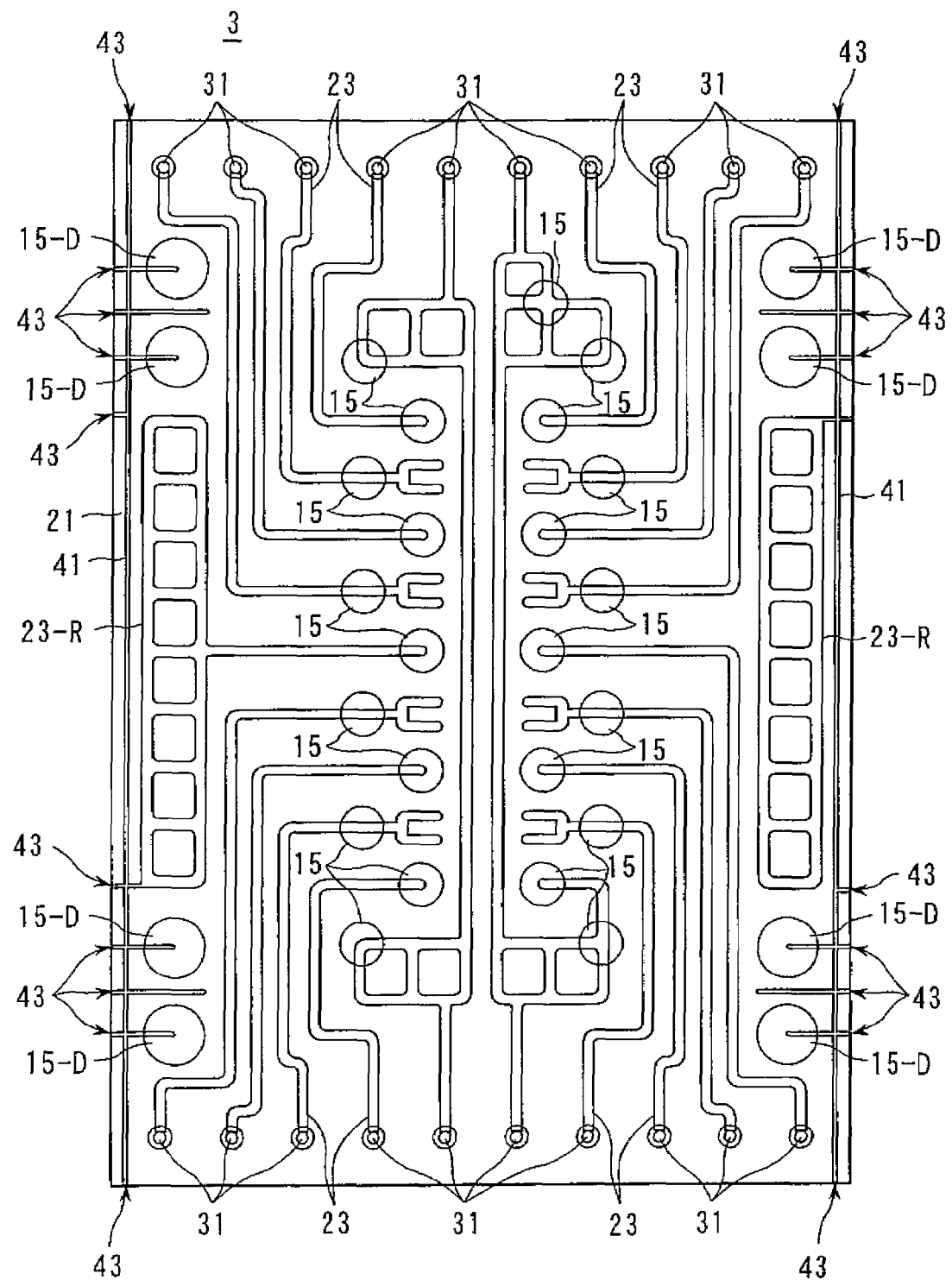
FIG. 13  Land plane

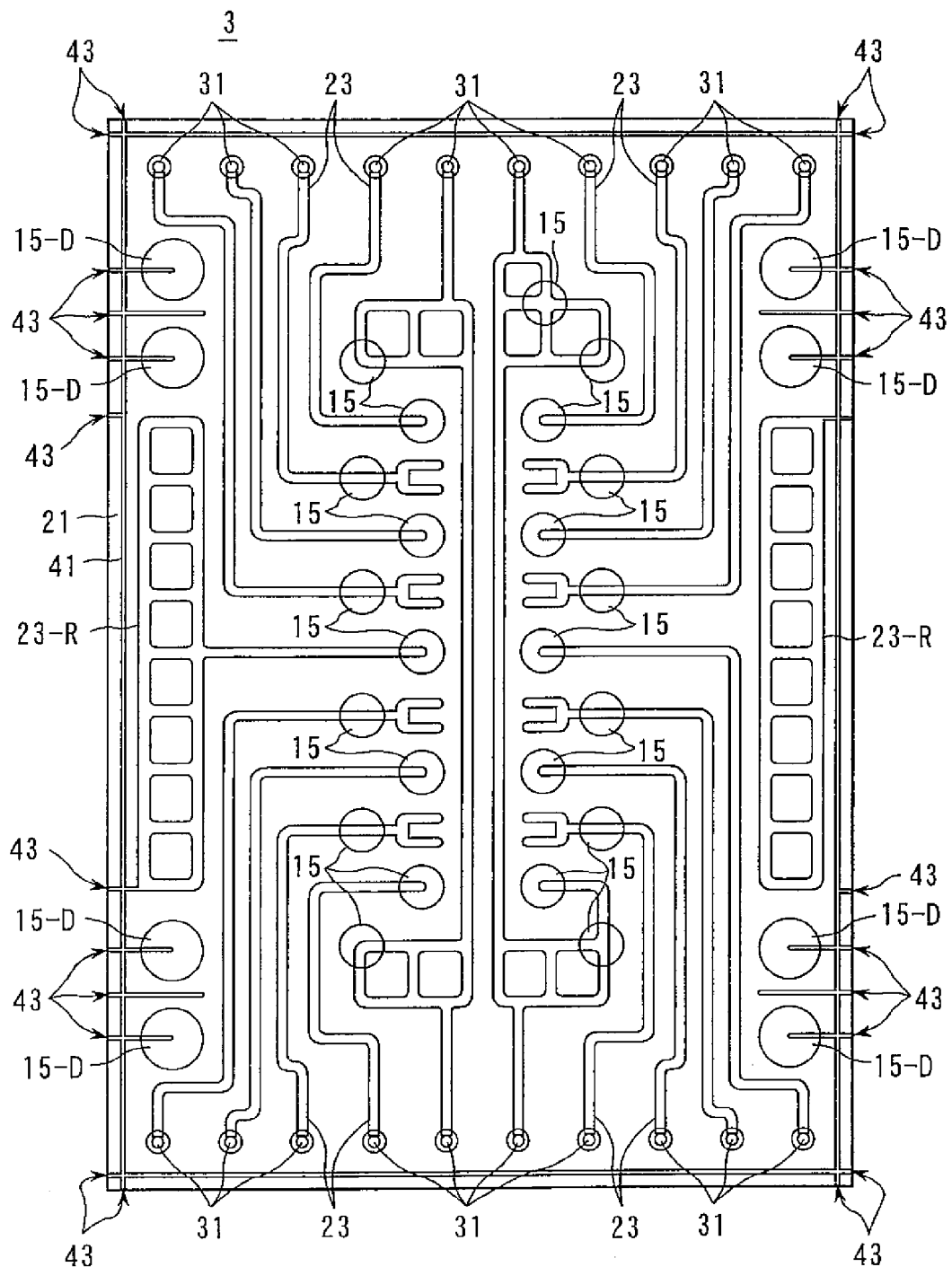
FIG. 14  Land plane

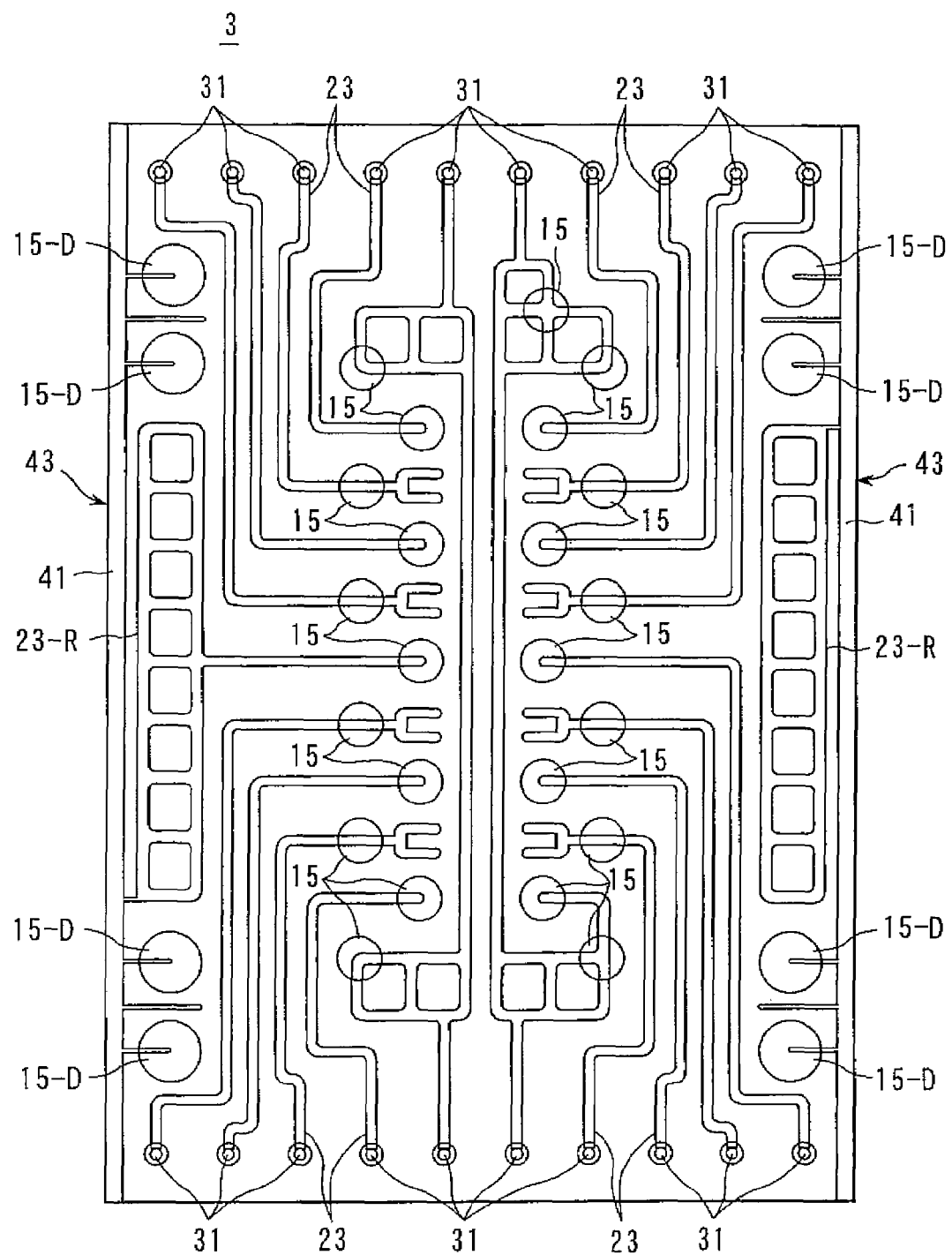
FIG. 16  Land plane

FIG. 18  Land plane

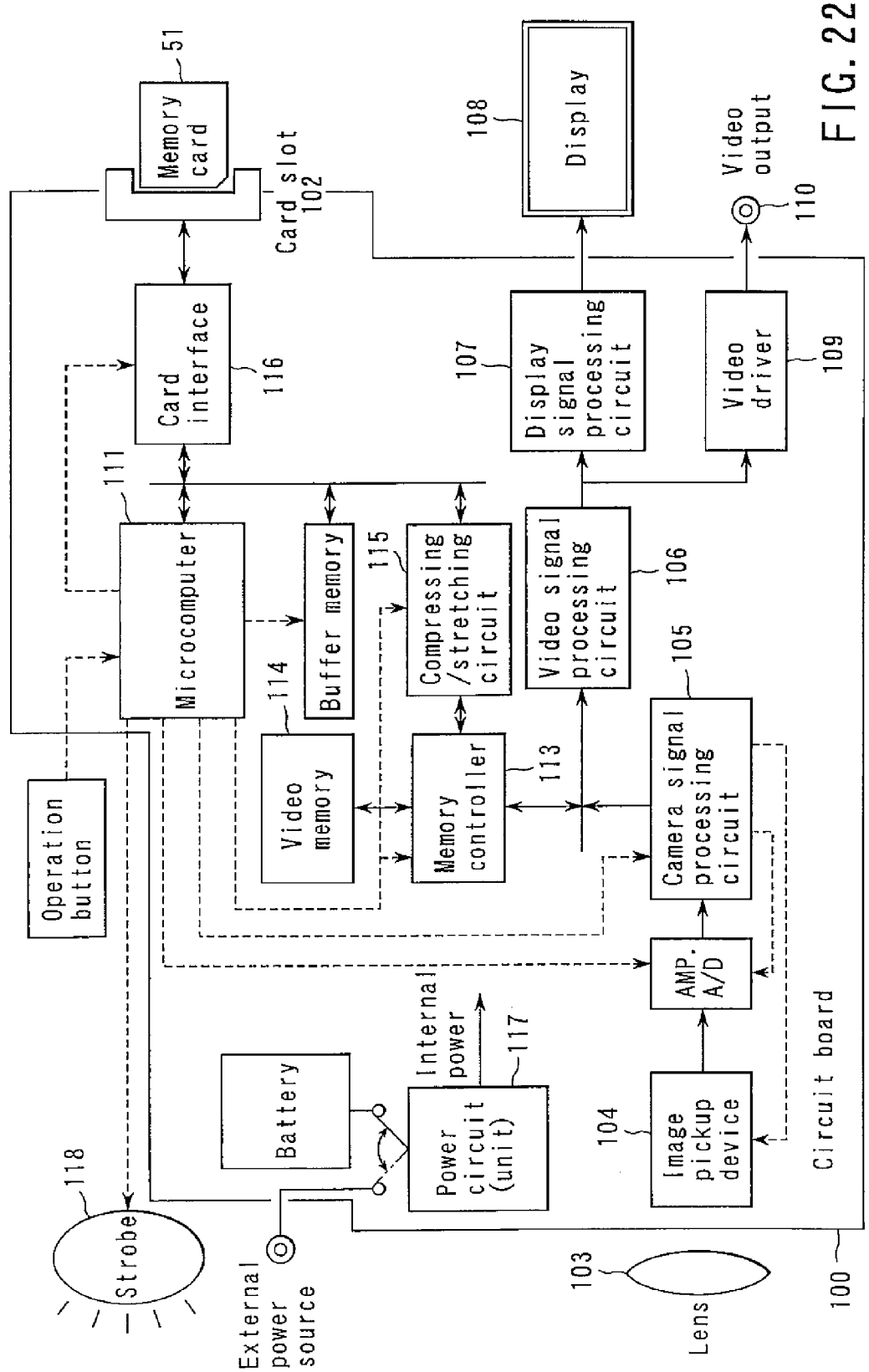

SEMICONDUCTOR DEVICE, ELECTRONIC CARD AND PAD REARRANGEMENT SUBSTRATE

CROSS-REFERENCE TO THE RELATED APPLICATIONS

This is a continuation of application Ser. No. 11/005,387 filed Dec. 6, 2004, which is a divisional of application Ser. No. 10/290,028 filed Nov. 6, 2002, now U.S. Pat. No. 7,095,102, issued Aug. 22, 2006, the entire contents of which are incorporated by reference. This application also claims benefit of priority under 35 U.S.C. § 119to Japanese Patent Application No. 2001-342294, filed on Nov. 7, 2001, the entire contents of which are incorporated herein by reference.

BACKGROUND OF THE INVENTION

1. Field of the Invention

The present invention relates to a semiconductor device, for example, a semiconductor device used for an electronic card.

2. Description of the Related Art

In recent years, IC cards and memory cards in which a semiconductor integrated circuit (IC) chip is buried in a card have come into wide use. In the following description, the above IC cards and memory cards, that is, cards in which the IC chip is buried are collectively called as an electronic card.

The electronic card can store large-capacity data as compared with existing magnetic cards and can be more readily downsized as compared with existing magnetic disks. From the above features, the electronic card is one of media having a possibility of being replaced with magnetic cards and magnetic disks in future.

In the field of the electronic card, high function and large capacity are required in addition to the above miniaturization, similarly to the IC chip. For this reason, the component mounting density of the IC chip in the electronic card is rapidly increasing. When the component mounting density becomes high, the distance from the card outer surface to the IC chip becomes narrow. As a result, this is a factor of increasing the possibility that an external surge is directly inputted to the IC chip.

In the electronic card, a human carrying the electronic card has high possibility that he becomes a source of surge. A portion having high possibility that the surge is inputted is a portion where the human unconsciously picks up the electronic card. As depicted in FIG. 25A, adjacent two corners of the electronic card are given as the above unconsciously picked-up portion. For example, two corner portions opposite to the side of the electronic card inserted into the electronic apparatus have attracted special interest.

As illustrated in 25B, the human are easy to unconsciously pick up the above two corner portions when inserting the electronic card into the electronic apparatus or pulling out of there. Such a tendency appears more remarkably when the electronic card is downsized, for example, a width Wcard of the electronic card becomes small.

As described above, when the electronic card is downsized and high-density mountability is improved, the IC chip mounted in the electronic card has high possibility that the surge is directly inputted to there. For this reason, any suitable steps must be taken with respect to not only the electronic card but also IC chips mounted in the electronic card.

BRIEF SUMMARY OF THE INVENTION

A semiconductor device according to a first aspect of the present invention comprises:
a substrate;
an external terminal provided on the substrate;
an internal wiring pattern provided in the substrate, and electrically connected to the external terminal;
a semiconductor chip mounted on the substrate, and electrically connected to the internal wiring pattern; and
an antenna pattern provided at a corner portion of the substrate so that it can be grounded.

An electronic card according to a second aspect of the present invention comprises:
a substrate;
an external terminal provided on the substrate;
an internal wiring pattern provided in the substrate, and electrically connected to the external terminal;
a semiconductor chip mounted on the substrate, and electrically connected to the internal wiring pattern;
an antenna pattern provided at a corner portion of the substrate so that it can be grounded; and
a card outer case housing the substrate and the semiconductor chip.

A pad rearrangement substrate according to a third aspect of the present invention comprises:
a dielectric substrate having a mounting plane mounted with a semiconductor chip, and an external terminal plane formed with an external terminal;
an internal terminal provided on the mounting plane of the dielectric substrate, and connected to a boding pad of the semiconductor chip;
an external terminal provided on the plane of the dielectric substrate where the external terminal is formed, and rearranging the bonding pad of the semiconductor chip so that the bonding pad can be connected to a circuit board;
an internal wiring pattern provided in the dielectric substrate, and connecting the external terminal to the internal terminal; and
an antenna pattern provided at a corner portion of the dielectric substrate and it can be grounded.

An electric device according to a fourth aspect of the present invention comprises:
a card interface;
a card slot connected to the card interface; and
an electronic card electrically connected to the card slot, the electronic card including:
a substrate;
an external terminal provided on the substrate;
an internal wiring pattern provided in the substrate, and electrically connected to the external terminal;
a semiconductor chip mounted on the substrate, and electrically connected to the internal wiring pattern;
an antenna pattern provided at a corner portion of the substrate so that it can be grounded; and
a card outer case housing the substrate and the semiconductor chip.

BRIEF DESCRIPTION OF THE SEVERAL VIEWS OF THE DRAWING

FIG. 5 is a top plan view showing the wiring patter of a bonding plane of the substrate included in the P-LGA package according to the first embodiment of the present invention;

FIG. 6 is a top plan view showing a state after a chip is mounted on the substrate included in the P-LGA package according to the first embodiment of the present invention;

FIG. 7A and FIG. 7B are views showing a first advantageous feature obtained from the P-LGA package according to the first embodiment of the present invention;

FIG. 8 is a view showing a second advantageous feature obtained from the P-LGA package according to the first embodiment of the present invention;

FIG. 10 is a top plan view showing one modification example of the P-LGA package according to the first embodiment of the present invention;

FIG. 12 is a top plan view showing the wiring pattern of a land plane of a substrate included in a P-LGA package according to a second embodiment of the present invention;

FIG. 13 is a top plan view showing the wiring pattern of a land plan of a substrate included in a P-LGA package according to a third embodiment of the present invention;

FIG. 14 is a top plan view showing the wiring pattern of a land plane of a substrate included in a P-LGA package according to a fourth embodiment of the present invention;

FIG. 16 is a top plan view showing the wiring pattern of a land plane of a substrate included in a P-LGA package according to an eighth embodiment of the present invention;

FIG. 22 is a block diagram showing the basic system configuration of a digital still camera;

DETAILED DESCRIPTION OF THE INVENTION

Figure 1A:
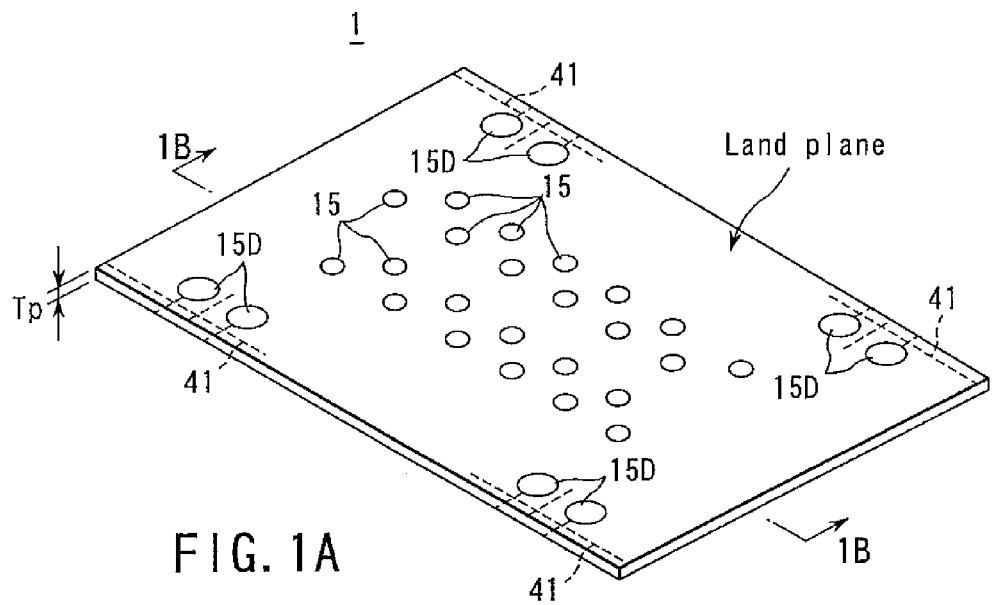
FIG. 1A is a perspective view showing an external appearance of a P-LGA package according to a first embodiment of the present invention.

The embodiments of the present invention will be described below with reference to the accompanying drawings. In the following description, common reference numerals are given to portions common to all drawings.

First Embodiment

Figure 1B:
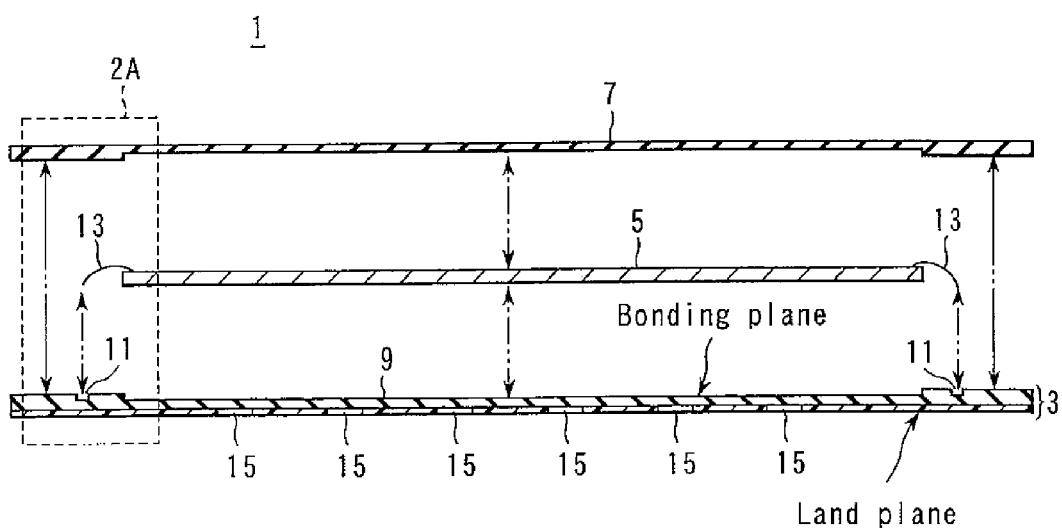
FIG. 1B is an exploded sectional view showing a cross section taken along the line 1B-1B of FIG. 1A.

FIG. 1A is a perspective view showing an external appearance of a plastic-land grid array (hereinafter, referred to as P-LGA) package according to a first embodiment of the present invention. FIG. 1B is an exploded sectional view showing a cross section taken along the line 1B-1B of FIG. 1A.

As shown in FIG. 1A and FIG. 1B, a P-LGA 1 according to the first embodiment includes a substrate 3, a semiconductor chip (hereinafter, referred to as IC chip) mounted on the substrate 3, and a dielectric sealing material 7 for sealing the above substrate 3 and IC chip 5.

The substrate 3 has a land plane and a bonding plane. The bonding plane is an IC chip mounting surface on which the IC chip 5 is mounted. On the other hand, the land plane is a mounting surface when the package 1 is mounted on a circuit board. The substrate 3 is a so-called pad rearrangement substrate for rearranging a bonding pad of the IC chip 5 so that the bonding pad is connectable with the circuit board.

The bonding plane is provided with a die bonding portion 9 and an internal terminal 11. The IC chip 5 is bonded onto the die bonding portion 9. The die bonding portion 9 of the package 1 according to the first embodiment is depressed in accordance with the shape of the IC chip 5. One of the reasons is because of thinning the thickness $T_P$ of the package 1 as much as possible. In this case, the depression corresponding to the shape of the IC chip 5 may be formed as the need arises. For example, the above thickness $T_P$ is set to a range from about 0.6 to 0.7 μm or less. One of the reasons of thinning the thickness $T_P$ is because the package 1 is plan to be mounted on electronic cards such as IC cards or memory cards. To give one example, the IC chip 5 is a non-volatile semiconductor memory device, for example, a NAND type flash memory.

The above internal terminal 11 is electrically connected to a bonding pad of the IC chip 5. The internal terminal 11 of the package 1 according to the first embodiment is electrically connected to the bonding pad of the IC chip 5 via a bonding wire 13.

The land plane is provided with an external terminal 15. The external terminal 15 is a portion, which is electrically connected to the patterns of a circuit board. Further, the external terminal 15 is electrically connected to the internal terminal 11 by the internal wiring patterns provided in the substrate 3. By doing so, the IC chip 5 is electrically connected to the patterns of the circuit board.

The package 1 according to the first embodiment is provided with the external terminal 15 electrically connected to the IC chip 5 actually, and a dummy external terminal 15-D, which is not electrically connected to the IC chip 5. The dummy external terminal 15-D is electrically connected to the grounded patterns of the circuit board.

The IC chip 5 is sealed with the dielectric sealing material 7, for example, dielectric plastic.

Figures 2A, 2B:
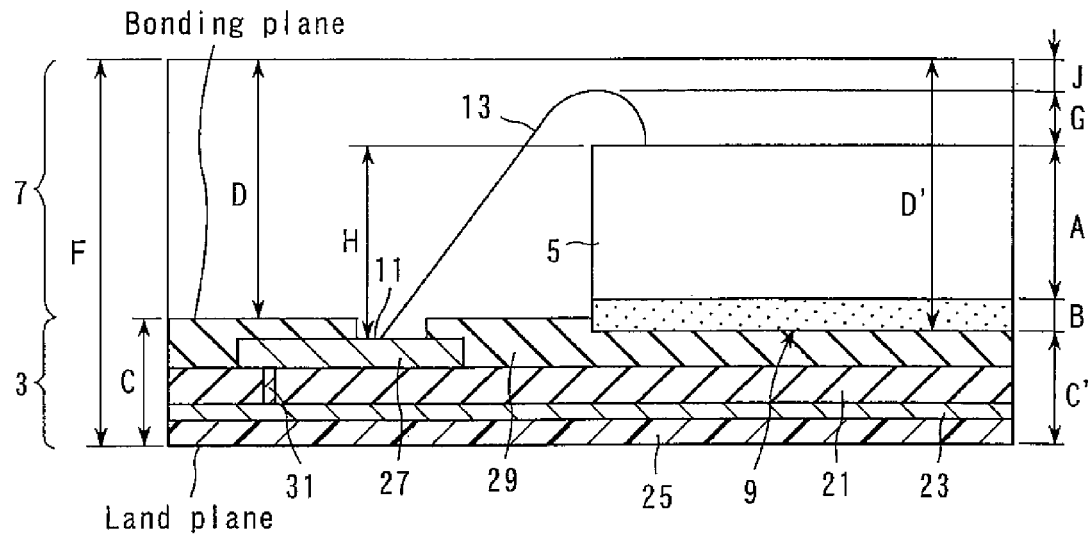
FIG. 2A is an enlarged sectional view showing a rectangular portion 2A shown by the broken line in FIG. 1B.
FIG. 2B is a table showing one example of the dimension of the section shown in FIG. 2A.

FIG. 2A is an enlarged sectional view showing a rectangular portion 2A shown by the broken line in FIG. 1B and FIG. 2B is a table showing one example of the dimension of the section shown in FIG. 2A.

As seen from FIG. 2A and FIG. 2B, the thickness (chip thickness) A of the IC chip 5 is 200±15 µm. The thickness (paste thickness) of paste for bonding the IC chip 5 to the die bonding portion 9, for example, the thickness (tape thickness) B of a bonding tape is 40±20 µm. The thickness (substrate thickness) C of the substrate 3 is 190±20 µm. The thickness (cavity thickness) D from the bonding plane of the dielectric sealing material 7 is 435±20 µm. The thickness (package thickness, equivalent to the thickness $T_P$ shown in FIG. 1A) F from the land plane to the upper surface of the dielectric sealing material 7 is 625±28 µm. The height (loop height) G of the bonding wire 13 on the IC chip 5 is 125±25 µm. The height, that is, the step (bonding step) H from the exposed surface of the internal terminal 11 to the bonding pad surface of the IC chip 5 is 250 µm. The thickness (resin thickness on wire) J of the dielectric sealing material 7 on the bonding wire 13 is 75±41 µm.

As depicted in FIG. 2A, the substrate 3 of the package 1 of the first embodiment includes a dielectric core material 21 and the following elements. One of the above elements is a land plane pattern (first interlayer wiring pattern) 23 provided on the land plane of the dielectric core material 21. Another is a dielectric layer 25 coating the above patterns 23 except the external terminal 15. Another is a bonding plane pattern (second interlayer wiring pattern) 27 provided on the bonding plane of the dielectric core material 21. Another is a dielectric layer 27 coating the above pattern 27 except the internal terminal 11. The bonding plane pattern 27 is connected to the land plane pattern 23 via a through hole 31 formed in the dielectric core material 21.

The following is a detailed description on the substrate 3 of the package 1 of the first embodiment.

Figure 3:
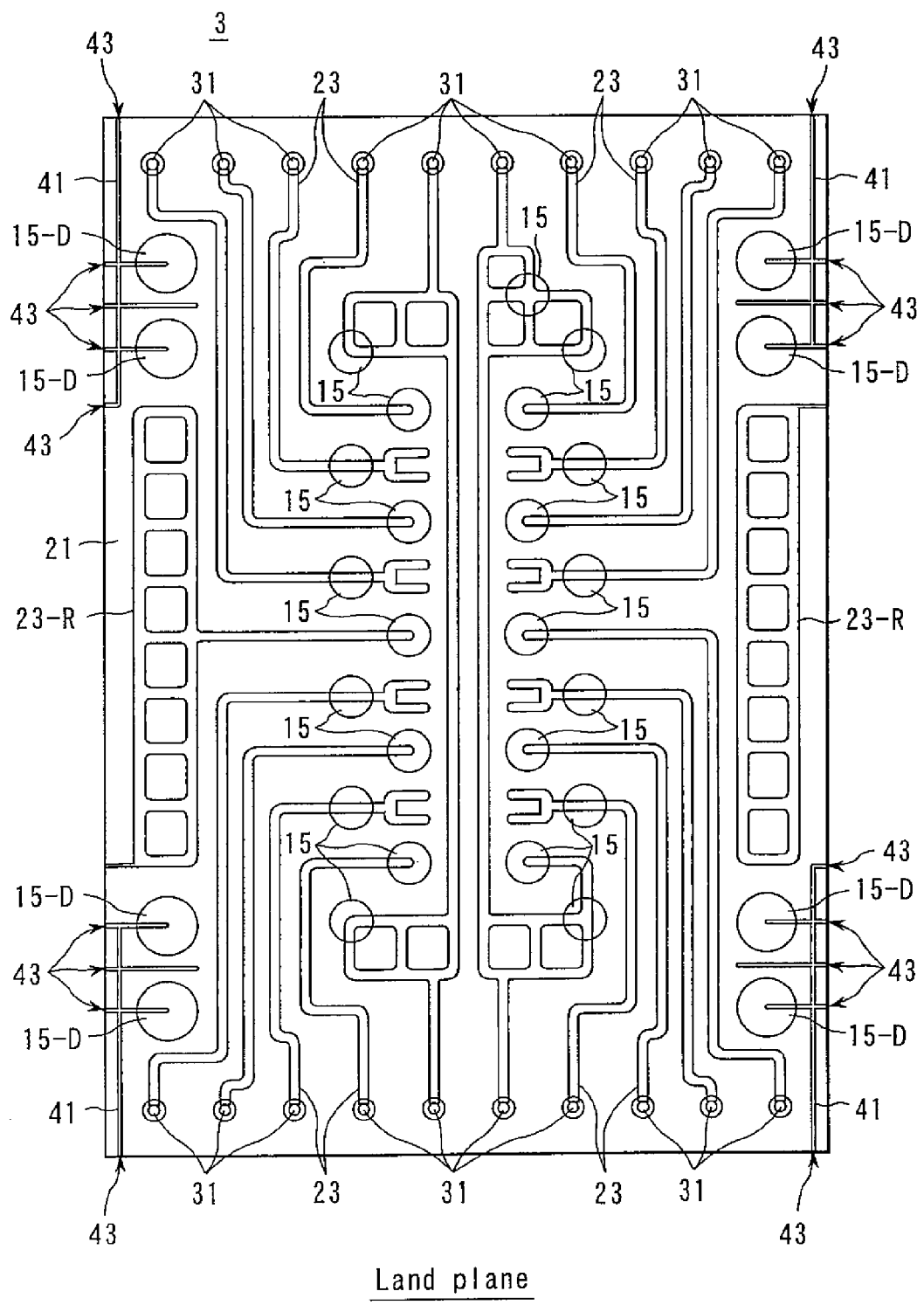
FIG. 3 is a top plan view showing the wiring pattern of a land plane of a substrate included in the P-LGA package according to the first embodiment of the present invention.

FIG. 3 is a top plan view showing the wiring pattern of a land plane of the substrate 3.

As seen from FIG. 3, the land plane pattern 23 is formed on the land plane of the dielectric core material 21. The material of the land plane pattern 23 is copper, and the thickness thereof is 20 µm, for example. The land plane pattern 23 is connected to the external terminal 15. The external terminal 15 is exposed outside from the land plane of the dielectric core material 21, but portions other than the external terminal 15 are coated with the dielectric layer 25. The wiring pattern of the dielectric layer 25 is shown in FIG. 4.

Figure 4:
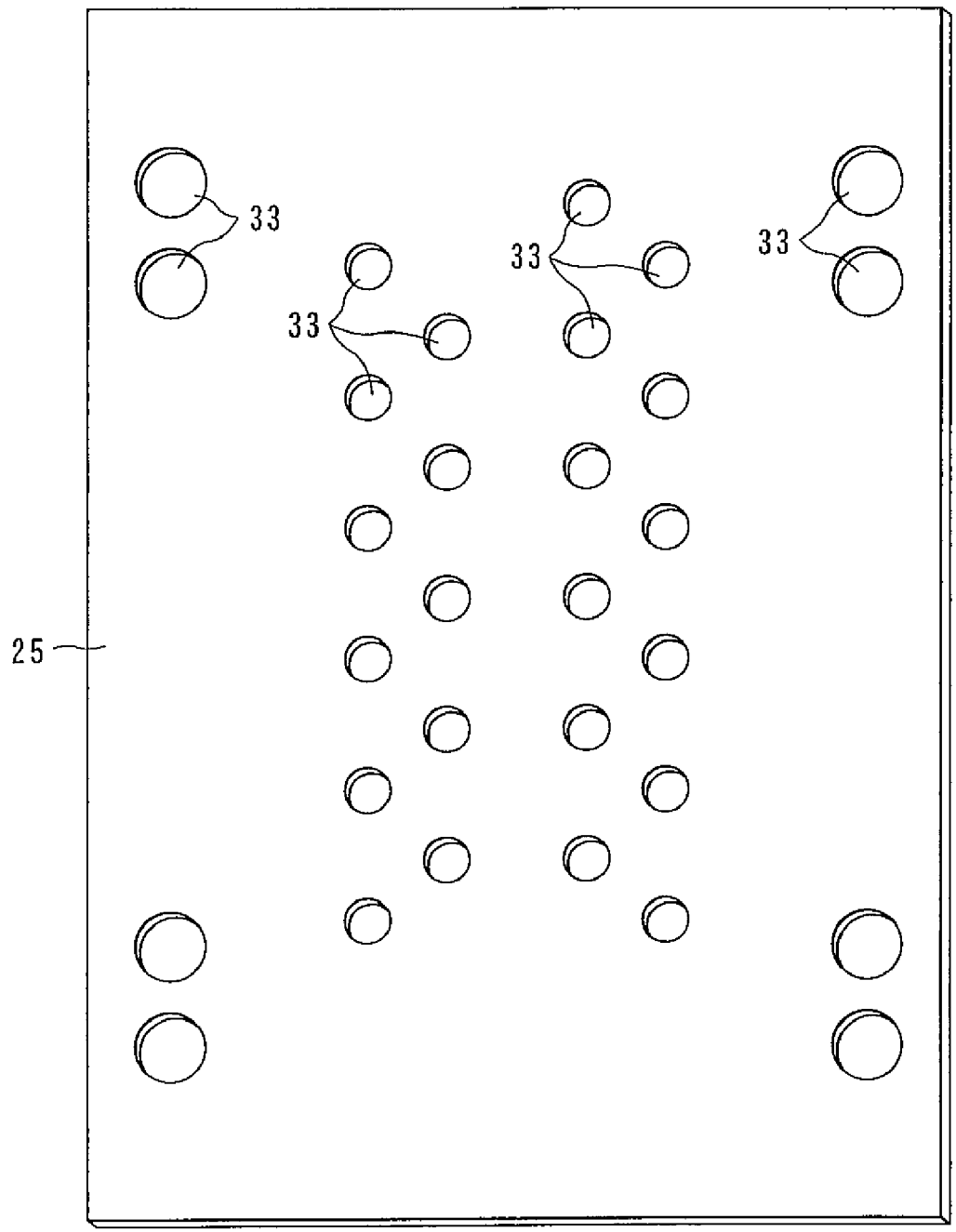
FIG. 4 is a top plan view showing the wiring pattern of a land plane dielectric layer of the substrate included in the P-LGA package according to the first embodiment of the present invention.
Figure 9B:
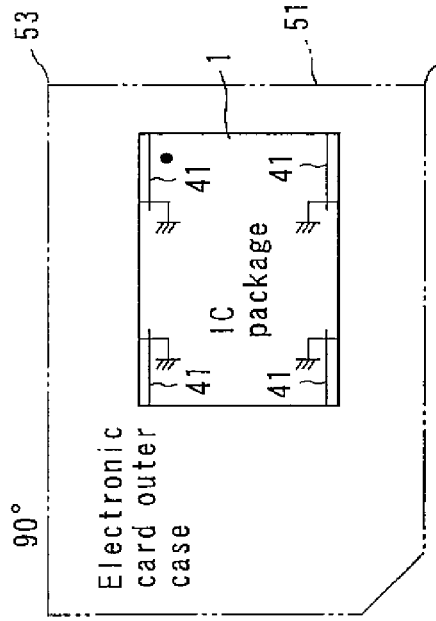
FIG. 9A to FIG. 9D are views showing a third advantageous feature obtained from the P-LGA package according to the first embodiment of the present invention.
Figure 9D:
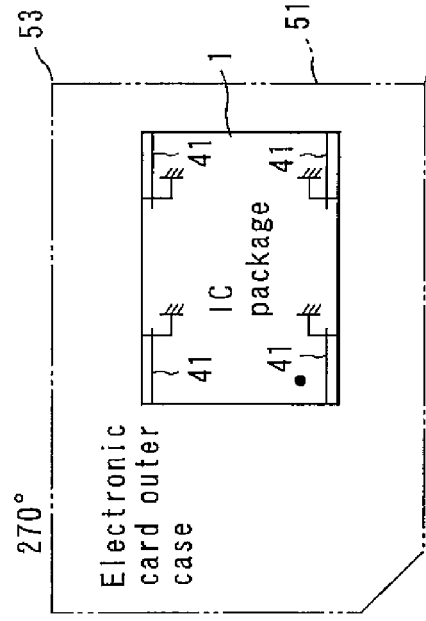
Figure 9A:
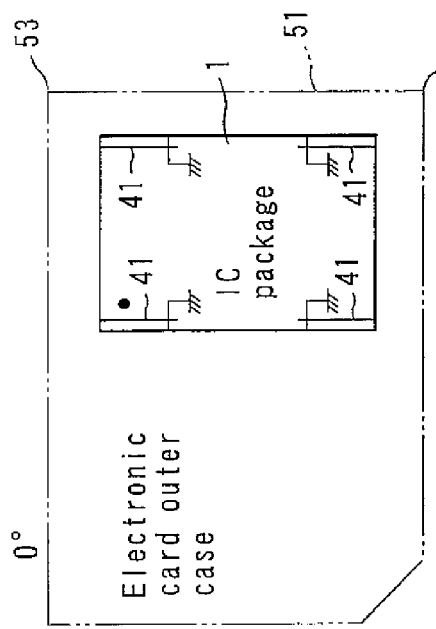
Figure 9C:
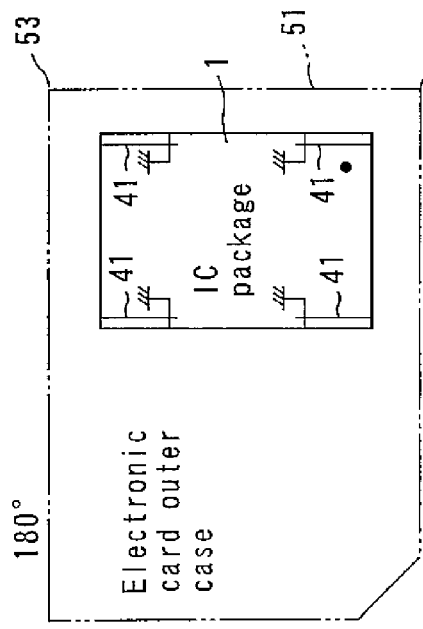

As seen from FIG. 4, the dielectric layer 25 has holes (openings) 33 formed for exposing the external terminal 15 and the dummy external terminal 15-D. The material of the dielectric layer 25 is solder resist. The dielectric layer 25 has a thickness of for example, 30 µm at the portion having no land plane pattern 23, and a thickness of for example, 20 µm at the portion having the land plane pattern 23.

The land plane pattern 23 is connected to the bonding plane pattern 27 via the through hole 31. FIG. 5 shows the bonding plane pattern 27, and FIG. 6 shows a state that the IC chip 5 is mounted on the bonding plane.

As illustrated in FIG. 5 and FIG. 6, the bonding plane pattern 27 connects the land plane pattern 23 led out of the through hole 31 to the internal terminal 11 provided on the bounding surface. In the first embodiment, the through hole 31 is formed in a line along mutually facing sides of four sides of the dielectric core material 21.

In the first embodiment, further, a wiring pattern (interconnection line) 41 is provided at each of four corners of the land plane of the dielectric core material 21. The wiring pattern 41 is connected to the dummy external terminal 15-D so that it can be grounded. In the following description, the wiring pattern 41 is called as an antenna pattern.

The P-LGA package 1 according to the first embodiment has the antenna pattern 41 inside. The antenna pattern 41 is provided at four corners of the package 1, for example, four corners of the substrate 3. Further, the antenna pattern 41 is grounded. Thus, when surge is inputted to the corners of the package 1, it is possible to release the surge to a ground point via the antenna pattern 41.

The antenna pattern 41 is provided at four corners of the package 1 as described above. Thus, when the package 1 is mounted on an electronic card, and the surge is inputted from adjacent two corners 53 of an electronic card outer case 51 as illustrated in FIG. 7A, it is also possible to release the surge to a ground point via the antenna pattern 41.

Of course, the antenna pattern 41 can release the surge inputted from mutually opposite two sides of the card outer case 51 as illustrated in FIG. 7B to the ground point, in addition to the surge inputted from adjacent two corners 53 of the card outer case 51 illustrated in FIG. 7A.

As described above, the package 1 according to the first embodiment has the antenna pattern 41 to be grounded at its four corners, for example, four corners of the substrate 3. By doing so, it is possible to protect the IC chip housed in the package from electrostatic breakdown.

As seen from the above description, the electrostatic breakdown resistance of the semiconductor device is improved. Therefore, the package 1 of the first embodiment is particularly effective in so-called high-density mounting such that a distance d from the surface of the card outer case 51 to the IC chip 5 is small. The distance d is 1 mm or less.

The antenna pattern 41 is provided at four corners of the package 1 housing the IC chip 5, for example, four corners of the substrate 3, and is not provided in the IC chip 5. Therefore, when carrying out the present invention, there is no need of doing the work for making design changes with respect to the IC chip 5. In other words, the best way of the present invention against the electrostatic breakdown is very simple; as a result, there is no rush increase in the manufacturing cost.

In addition, the following is a description on one of the advantageous features when the antenna pattern 41 is provided at the package 1, for example, four corners of the substrate 3. For example even if the package 1 is housed in the card outer case 51 in various angular directions, 0°, 90°, 180° and 270° as shown in FIG. 9A to FIG. 9D, the antenna pattern 41 is close to adjacent two corners 53 of the card outer case 51. In other words, flexibility relevant to package arrangement is high when the package 1 is housed in the card outer case 51.

However, as depicted in FIG. 10, if the arrangement of the package 1 in the card outer case 51 is determined, the antenna pattern 41 may be provided at only adjacent two corners of the package in accordance with adjacent twp corners 53.

The following is a description on a method of forming the antenna pattern 41.

Figure 11:
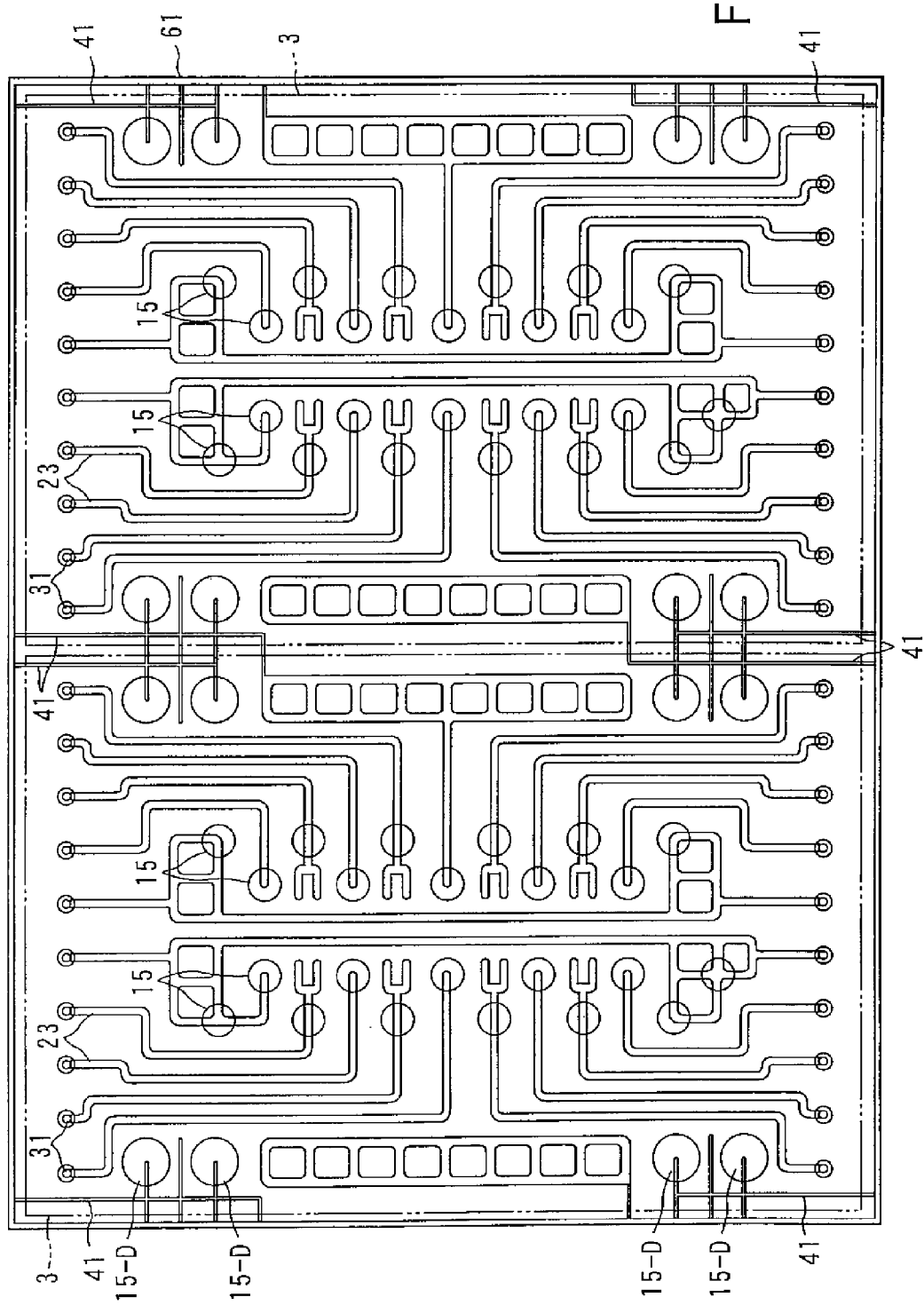
FIG. 11 is a top plan view showing a method of forming an antenna pattern of the substrate included in the P-LGA package according to the first embodiment of the present invention.

FIG. 11 is a top plan view showing a method of forming the antenna pattern. FIG. 11 shows a top plan view of a dielectric frame before the substrate 3 is cut off, for example, a top plan view of the land plane side of glass-epoxy frame, which is provided with two portions used as the substrate 3.

As seen from FIG. 11, a wiring pattern 61 surrounds the portion used as the substrate 3. The wiring pattern 61 is a plating pattern used when forming the dummy external terminal 15-D by plating, e.g., electroplating. The wiring pattern 61 extends to the portion used as the substrate 3, and the dummy external terminal 15-D is formed at the distal end of the substrate 3 by electroplating. Also, the external terminal 15 is formed by electroplating. The plating pattern of the external terminal 15 is formed in a layer different from the plating pattern 61, e.g., on a bonding plane. The above plating pattern is not shown in FIG. 11; however, part of the plating pattern is shown by the reference numeral 63 of FIG. 5 and FIG. 6.

The conductive layer identical to the land plane pattern 23, e.g., a copper foil may be used for forming the plating pattern 61. Thus, the following advantageous feature can be obtained. That is, the plating pattern 61 is used as the antenna pattern 41, and thereby, there is no need of newly forming the conductive layer in order to form the antenna pattern 41.

For example, if the plating pattern 61 is used as the antenna pattern 41, as shown in FIG. 3, the antenna pattern 41 is provided with a portion 43 exposed from the end of the substrate 3. By doing so, the antenna pattern 41 is extended to the outside from the land plane pattern 23 formed in the substrate 3, that is, close to the card outer case 51. One of the above advantageous features is that the surge is easy to be inputted to the antenna pattern 41 rather than the land plane pattern 23. The principle is substantially the same as a lightning rod. If the surge is easy to be inputted to the antenna pattern 41 rather than the land plane pattern 23, it is possible to further protect the IC chip 5 from electrostatic breakdown.

The exposed portion 43 may be intactly held in the state of being exposed on the outside of the package 1 from the end of the substrate 3. If necessary, the exposed portion 43 may be sealed in the package by the dielectric sealing material.

In order to expose the antenna pattern 41 from the end of the substrate 3, the present invention is not limited to only use of the plating pattern 61. For example, the antenna pattern 41 may be exposed from the end of the substrate 3.

Second Embodiment

The substrate 3 shown in FIG. 3 is provided with a reinforcing pattern 23-R for preventing the deformation of the package 1, in addition to the land plane pattern 23 and the antenna pattern 41. The reinforcing pattern 23-R is provided at the space of the land plane pattern 23 where the pattern becomes sparse, as the need arises.

In the second embodiment, the reinforcing pattern 23-R is used as the antenna pattern, in addition to the antenna pattern 41 provided at corners of the land plane.

FIG. 12 is a top plan view showing a land plane pattern of a substrate 3 according to the second embodiment of the present invention.

As illustrated in FIG. 12, the reinforcing pattern 23-R is connected to a ground terminal Vss of the external terminals 15. By doing so, the reinforcing pattern 23-R performs the same function as the antenna pattern 41. Of the external terminals 15, if the reinforcing pattern 23-R electrically floating is connected to the antenna pattern 41, it performs the same function as the antenna pattern 41.

According to the second embodiment, another antenna pattern is provided between the antenna patterns, in addition to the antenna pattern 41 formed at the corners of the package 1, e.g., the corners of the substrate 3. As a result, the region provided with the antenna pattern 41 becomes wide; therefore, it is possible to further securely protect the IC chip 5 from electrostatic breakdown.

Third Embodiment

FIG. 13 is a top plan view showing a land plane pattern of a substrate 3 according to a third embodiment of the present invention.

As illustrated in FIG. 13, the antenna pattern 41 is not only formed at each of adjacent corners of the substrate 3, but also may be formed so as to connect adjacent corners.

According to the third embodiment, the region provided with the antenna pattern 41 becomes wider than the first embodiment. Therefore, it is possible to further securely protect the IC chip 5 from electrostatic breakdown, like the second embodiment.

Fourth Embodiment

FIG. 14 is a top plan view showing a land plane pattern of a substrate 3 according to a fourth embodiment of the present invention.

As illustrated in FIG. 14, the antenna pattern 41 is not only formed at each of adjacent corners of the substrate 3, but also may be formed over the entire periphery of the substrate 3.

According to the fourth embodiment, the region provided with the antenna pattern 41 becomes wider than the above first to third embodiments. Therefore, it is possible to further securely protect the IC chip 5 from electrostatic breakdown.

The antenna pattern 41 is formed over the entire periphery of the substrate 3, and thereby, the land plane pattern 23 can be surrounded with the antenna pattern 41. The land plane pattern 23 is surrounded with the antenna pattern 41, and thereby, surge is further hard to be inputted to the land plane pattern 23.

Fifth Embodiment

The fifth embodiment relates to the width of the antenna pattern 41.

Figure 15A:
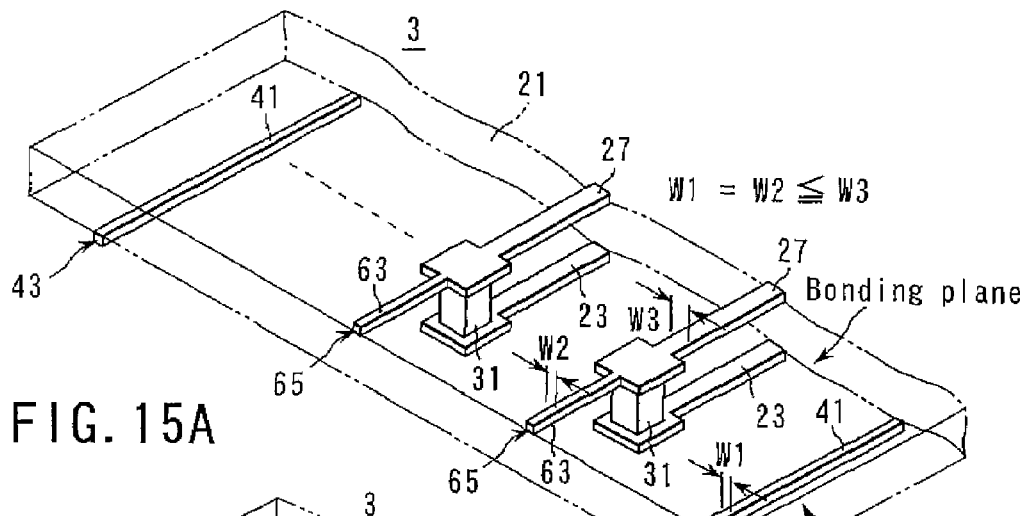
FIG. 15A is a perspective view showing a substrate included in a P-LGA package according to a fifth embodiment of the present invention.

FIG. 15A is a perspective view showing a substrate 3 of a P-LGA package according to the fifth embodiment of the present invention.

As seen from FIG. 15A, according to a first example of the width W1 of the antenna pattern 41, the width 1 is set equal to the width W2 of the plating pattern 63. The width W2 of the plating pattern 63 is less than the width W3 of the bonding plane pattern 27 (or land plane pattern 23). In FIG. 15A, a reference numeral 65 denotes a portion where the end of the plating pattern 63 is exposed from the end of the substrate 3.

Sixth Embodiment

The sixth embodiment relates to the width of the antenna pattern 41, like the fifth embodiment.

Figure 15B:
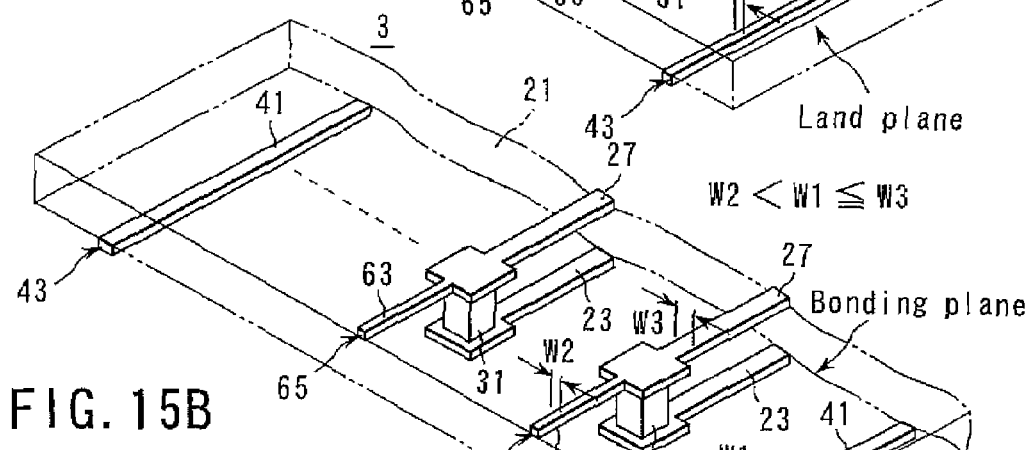
FIG. 15B is a perspective view showing a substrate included in a P-LGA package according to a sixth embodiment of the present invention.

FIG. 15B is a perspective view showing a substrate 3 of a P-LGA package according to the sixth embodiment of the present invention.

As seen from FIG. 15B, according to a second example of the width W1 of the antenna pattern 41, the width W1 is set wider than the width W2 of the plating pattern 63. The width W1 of the antenna pattern 41 is less than the width W3 of the bonding plane pattern 27 (or land plane pattern 23). In FIG. 15A, a reference numeral 65 denotes a portion where the end of the plating pattern 63 is exposed from the end of the substrate 3.

According to the sixth embodiment, the width W1 of the antenna pattern 41 is set wider than the width W2 of the plating pattern 63. Therefore, the surge is further easy to be inputted to the antenna pattern 41, as compared with the plating pattern 63.

Seventh Embodiment

The seventh embodiment relates to the width of the antenna pattern 41, like the fifth and sixth embodiments.

Figure 15C:
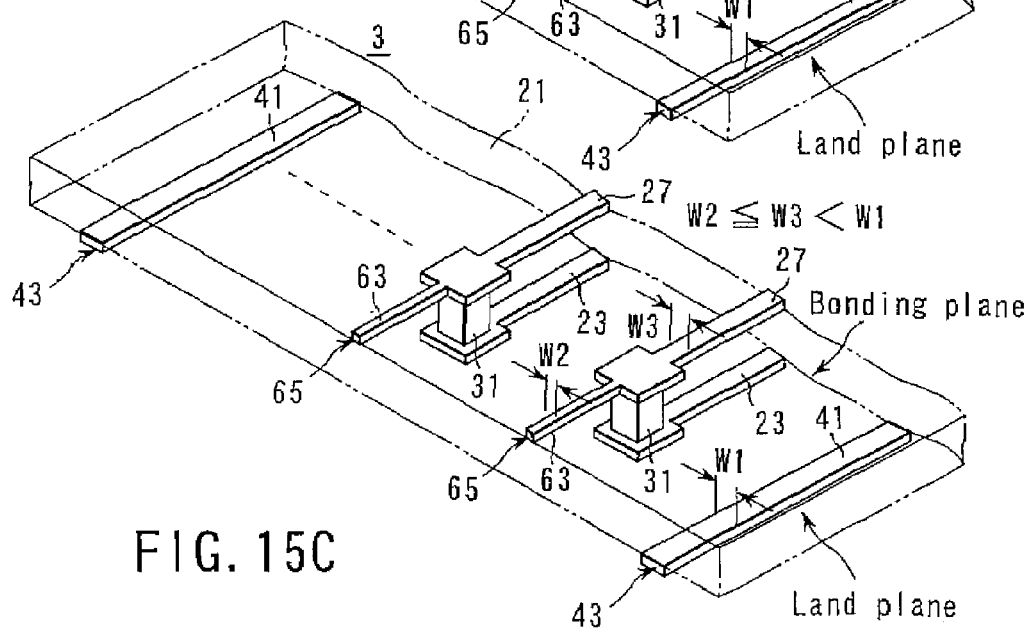
FIG. 15C is a perspective view showing a substrate included in a P-LGA package according to a seventh embodiment of the present invention.

FIG. 15C is a perspective view showing a substrate 3 of a P-LGA package according to the seventh embodiment of the present invention.

As seen from FIG. 15C, according to a third example of the width W1 of the antenna pattern 41, the width W1 is set wider than the width W2 of the plating pattern 63 and the width W3 of the bonding plane pattern 27 (or land plane pattern 23). According to the seventh embodiment, the width W1 of the antenna pattern 41 is set further wider than the sixth embodiment. Therefore, the surge is further easy to be inputted to the antenna pattern 41, as compared with the plating pattern 63.

Eighth Embodiment

FIG. 16 is a top plan view showing a land plane pattern of a substrate 3 according to an eight embodiment of the present invention.

As illustrated in FIG. 16, in the eighth embodiment, the antenna pattern 41 is provide so as to connect adjacent corners, and is exposed along the end of the substrate 3.

According to the eighth embodiment, the area of the exposed portion 43 of the antenna pattern 41 is wider than the first embodiment. Therefore, the surge is easy to be inputted to the antenna pattern 41.

Figure 17:
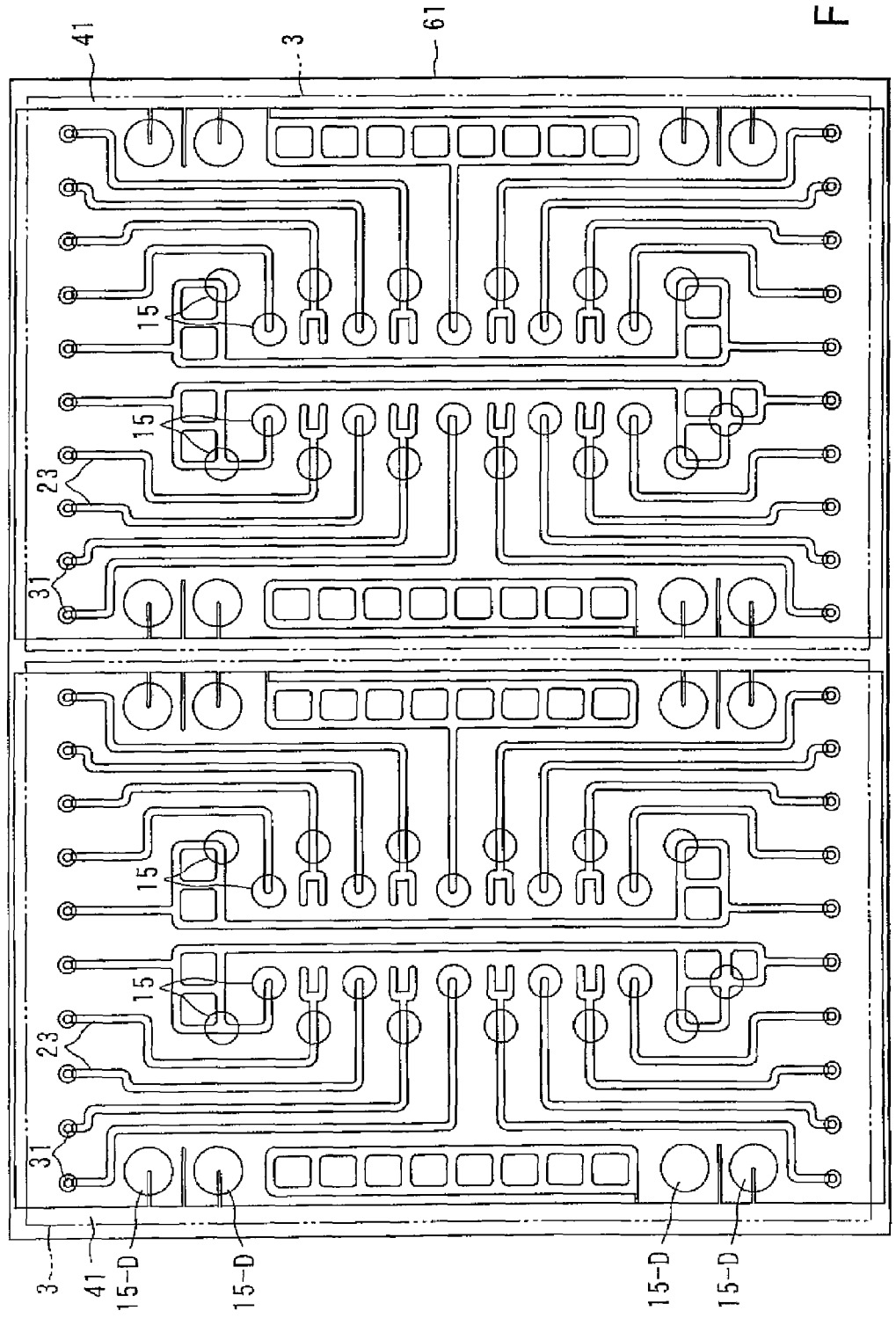
FIG. 17 is a top plan view showing a method of forming an antenna pattern of the substrate included in the P-LGA package according to the eighth embodiment of the present invention.

Further, according to the eighth embodiment, as shown in FIG. 17, the plating pattern 61 is formed out of a simple line pattern, so that the antenna pattern 41 can be readily formed. Therefore, it is possible to easily form the antenna pattern.

Ninth Embodiment

Figure 18:
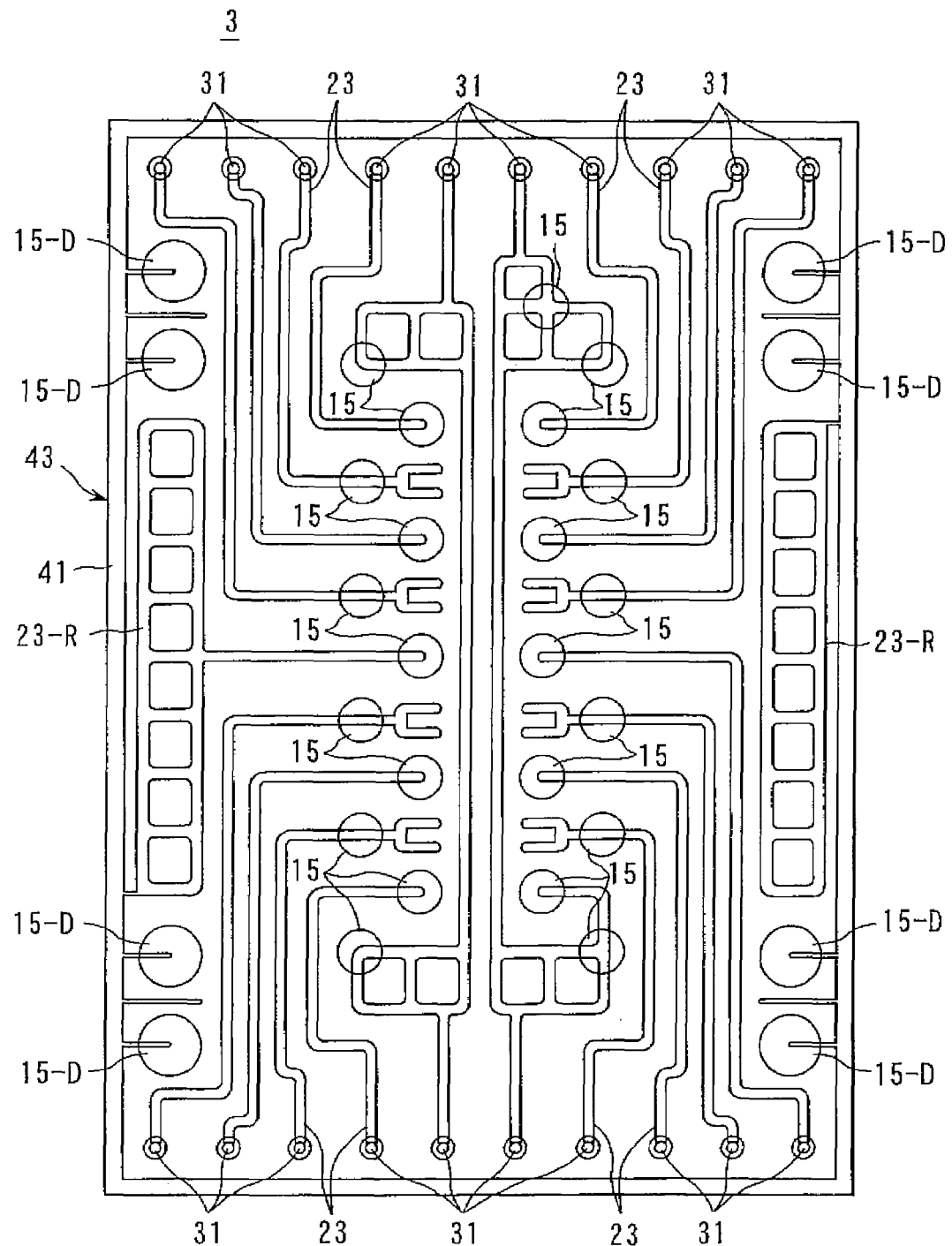
FIG. 18 is a top plan view showing the wiring pattern of a land plane of a substrate included in a P-LGA package according to a ninth embodiment of the present invention.

FIG. 18 is a top plan view showing a land plane pattern of a substrate 3 according to a ninth embodiment of the present invention.

As shown in FIG. 18, in the ninth embodiment, the antenna pattern 41 is formed over the entire periphery of the substrate 3, and is all exposed from the end of the substrate 3.

According to the ninth embodiment, the area of the exposed portion 43 of the antenna pattern 41 is wider than the first embodiment. Therefore, the surge is easy to be inputted to the antenna pattern 41.

Figure 19:
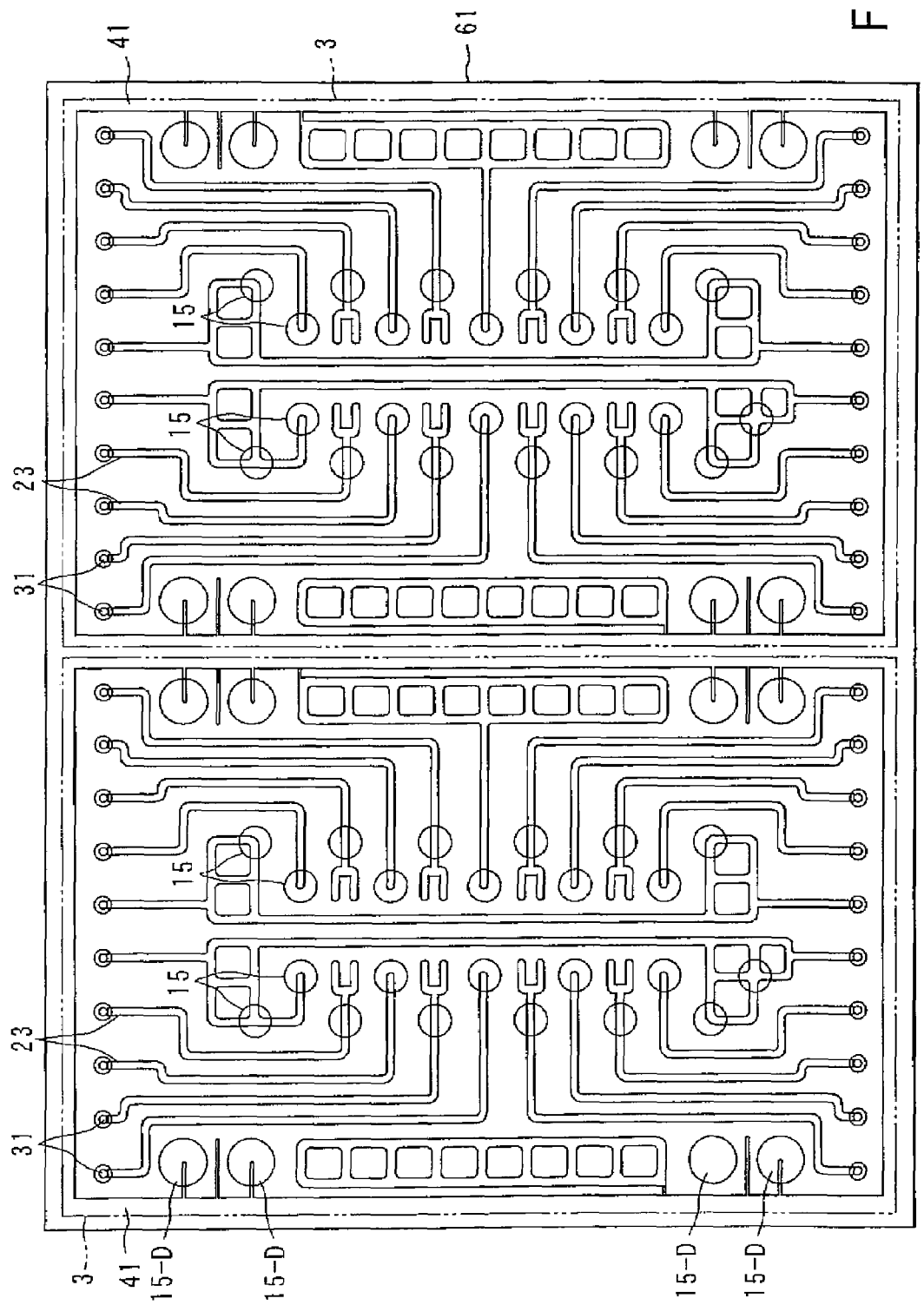
FIG. 19 is a top plan view showing a method of forming an antenna pattern of the substrate included in the P-LGA package according to the ninth embodiment of the present invention.

Further, according to the ninth embodiment, as shown in FIG. 19, the plating pattern 61 is formed out of a simple frame pattern, so that the antenna pattern 41 can be readily formed. Therefore, in the ninth embodiment, it is possible to easily form the antenna pattern, like the eighth embodiment.

Tenth Embodiment

Figure 20B:
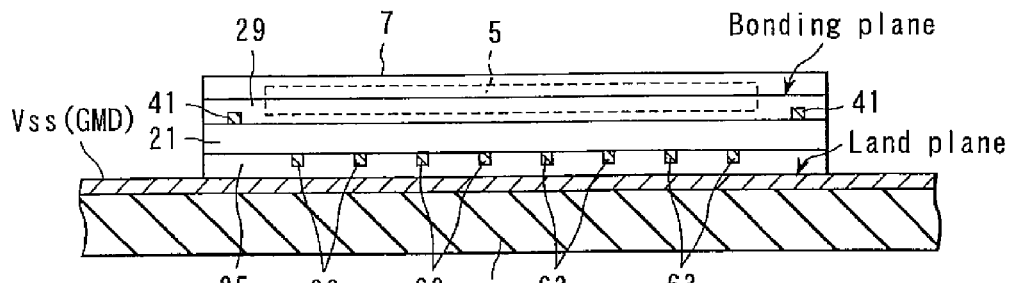
FIG. 20B is a sectional view showing a state that the P-LGA package according to a tenth embodiment of the present invention is mounted on a circuit board.
Figure 20A:
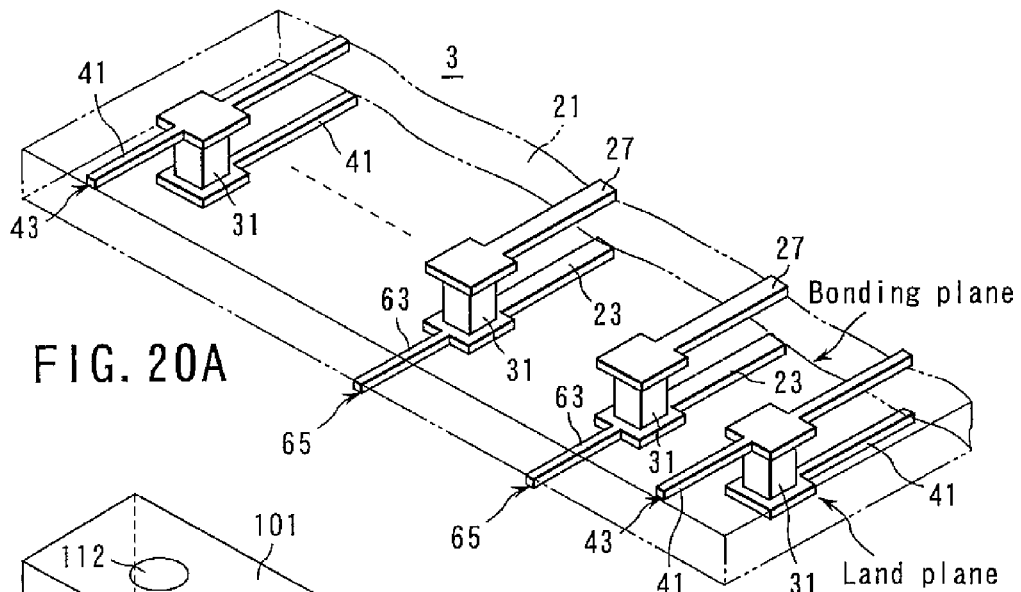
FIG. 20A is a perspective view showing a substrate included in a P-LGA package according to a tenth embodiment of the present invention.

FIG. 20A is a perspective view showing a substrate 3 according to a tenth embodiment of the present invention. FIG. 20B is a sectional view showing a state that the P-LGA package according to the tenth embodiment of the present invention is mounted on a circuit board.

As illustrated in FIG. 20A, in the tenth embodiment, the antenna pattern 41 is provided on the bonding plane of the substrate 3, that is, the bonding plane of the dielectric core material 21.

The tenth embodiment is based on the presumption that the external terminal 15 is formed on the land plane of the dielectric core material 21. The antenna pattern 41 on the bonding plane is connected to the antenna pattern 41 formed on the land plane via the through hole 31.

As described above, the antenna pattern 41 can be provided on the bonding plane of the substrate 3 as well as the land plane thereof.

When the antenna pattern 41 is provided on the bonding plane of the substrate 3, the plating pattern 63 may be provided on the land plane of the substrate 3, that is, the land plane of the dielectric core material 21. In this case, the following advantageous feature is obtained. As shown in FIG. 20B, when the package 1 is mounted on a circuit board 71, the end portion of the substrate 3, that is, the plating pattern 63 exposed from the end of the dielectric core material 21 is held between the antenna pattern 41 and the ground wiring pattern Vss (GND) provided on the circuit board 71. The exposed plating pattern 63 is held between the antenna pattern 41 and the ground wiring pattern Vss (GND), and thereby, it is possible to reduce the possibility that surge is inputted to the plating pattern 63.

As seen from FIG. 20A, in the tenth embodiment, the antenna pattern 41 has a two-layer structure comprising the antenna pattern 41 provided on the land plane and the same one provided on the bonding plane.

Thus, the antenna pattern 41 may have a multiplayer structure. The antenna pattern 41 has the multiplayer structure, and thereby, surge is easy to be inputted to the antenna pattern.

Eleventh Embodiment

The eleventh embodiment will describe application examples of the electronic card using the semiconductor integrated circuit described in the above first to tenth embodiments.

Figure 21:
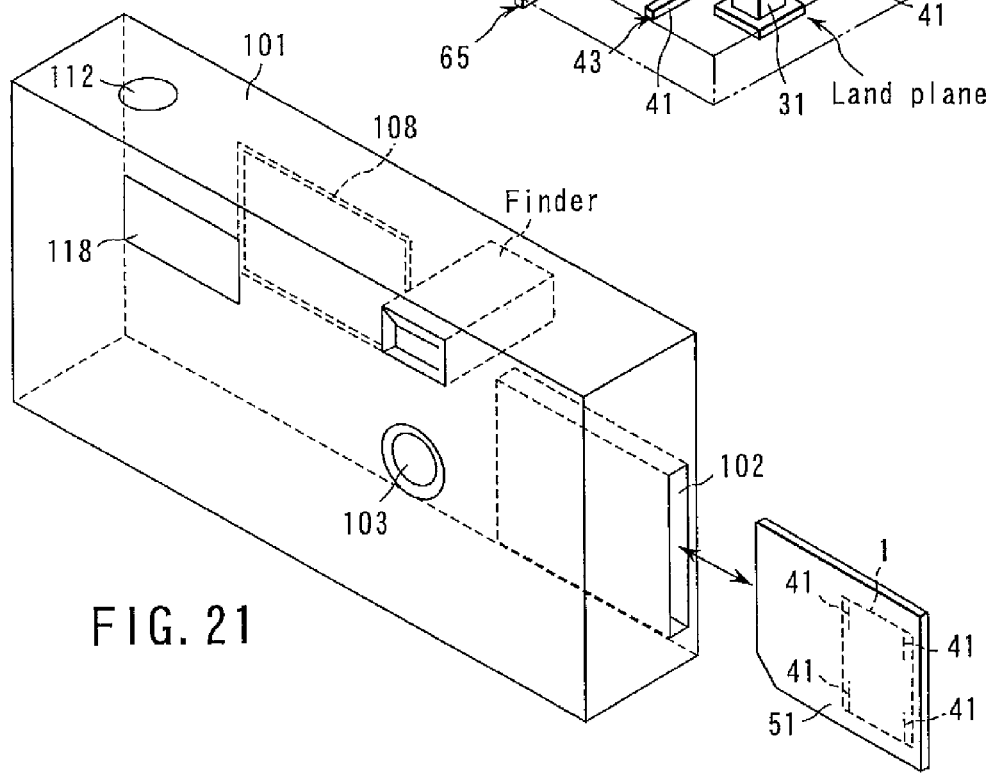
FIG. 21 is a perspective view showing one electronic apparatus employing the electronic card using the semiconductor integrated circuit device described in the above first to tenth embodiments.

FIG. 21 is a perspective view showing one example of electronic apparatuses employing the electronic card using the semiconductor integrated circuit described in the above first to tenth embodiments. In FIG. 21, a portable (mobile) electronic apparatus, for example, a digital still camera is shown as one example of the above electronic apparatuses. In this case, the electronic card is a memory card 51, which is used as recording media of a digital still camera 101. In FIG. 21, there is shown the IC package 1 having the antenna pattern 41 described in the above first embodiment. A case of the digital still camera includes a card slot 102 and a circuit board connected to the card slot 102. The circuit board is not illustrated in FIG. 21. The memory card 51 is inserted into the card slot 102 of the digital still camera 101 in a removable state. By doing so, the memory card 51 is electrically connected to an electronic circuit on the circuit board. For example, if the electronic card is a non-contact type IC card, the IC card is housed in the card slot 102 or brought near thereto, and thereby, electrically connected to an electronic circuit on the circuit board by a radio signal.

FIG. 22 is a block diagram showing the configuration of a basic system of the digital still camera.

Light from an object is collected by a lens 103, and thereafter, inputted to an image pickup device 104. The image pickup device 104 photo-electrically converts the inputted light into an analog signal. The image pickup device 104 is a CMOS image sensor, for example. The analog signal is amplified by an analog amplifier (AMP), and thereafter, converted into a digital signal by an A/D converter (A/D). The digitized signal is inputted to a camera signal processing circuit 105, and converted into a luminance signal and a color difference signal after automatic exposure control (AE), automatic white balance control (AWB) and color separation processing are carried out.

When monitoring an image, the signal outputted from the camera signal processing circuit 105 is inputted to a video signal processing circuit 106, and thereafter, converted into a video signal. For example, NTSC (National Television System Committee) is recited as the video signal system. The video signal is outputted to a display section 108 of the digital still camera 101 via a display signal processing circuit 107. The display section 108 is a liquid crystal monitor. Further, the video signal is outputted to a video output terminal 110 via a video driver 109. The image picked-up by the digital still camera 101 is outputted to image apparatuses, e.g., a television, via the video output terminal 110; therefore, the user can enjoy the picked-up image besides the display section 108. A microcomputer 111 controls the above image pickup device 104, analog amplifier (AMP), A/D converter (A/D), and camera signal processing circuit 105.

When capturing the image, the user pushes an operation button, for example, a shutter button 112. Whereupon the microcomputer 111 controls a memory controller 113 so that the signal outputted from the camera signal processing circuit 105 can be written as frame image into a video memory 114. The frame image written into the video memory 114 is compressed based on predetermined format by a compressing/stretching circuit 115, and thereafter, recorded to the memory card 51 inserted (loaded) into the card slot via a card interface 116.

When reproducing (playing back) the recorded image, the image recorded in the memory card 51 is read via the card interface 116, and stretched by the compressing/stretching circuit 115, thereafter, is written into the video memory 114. The written image is inputted to the video signal processing circuit 106, and is projected on the display section 108 and image apparatuses, similarly to the case of monitoring the image.

The basic system includes the following components mounted on a circuit board 100. The components are the above card slot 102, image pickup device 104, analog amplifier (AMP), A/D converter, camera signal processing circuit 105, video signal processing circuit 106, display device 107, video driver 109, microcomputer 111, memory controller 113, video memory 114, compressing/stretching circuit 115 and card interface 116. In this case, the card slot need not to be mounted on the circuit board 100, and may be connected to the circuit board 100 by connector cable and the like. In the eleventh embodiment, a power circuit 117 is further mounted on the circuit board 100. The power circuit 117 receives a power supply from an external power source or battery so as to generate an internal power used in the digital still camera 101. The power circuit 117 is a DC/DC converter, for example. The internal power is supplied to the above circuits as operating power, and besides, supplied as the power of a strobe 118 and the power of the display section 108.

Figure 23A:
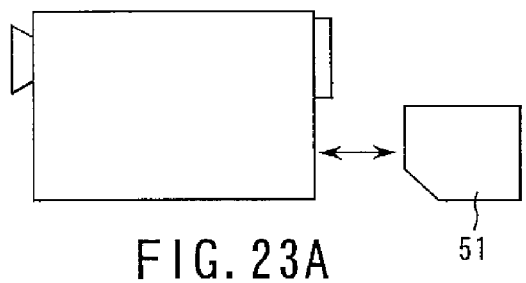
FIG. 23A to FIG. 23J are views showing application examples employing the electronic card using the semiconductor integrated circuit device described in the above first to tenth embodiments.
Figure 23B:
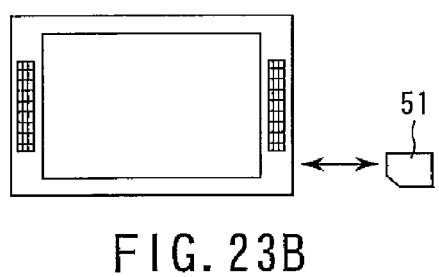
Figure 23C:
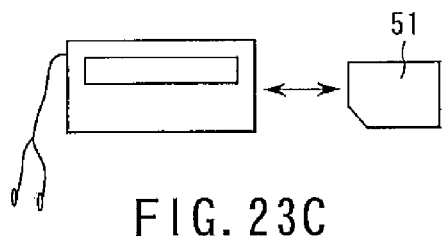
Figure 23D:
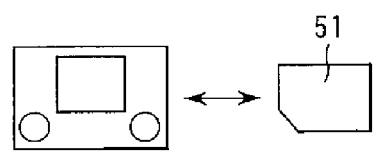
Figure 23E:
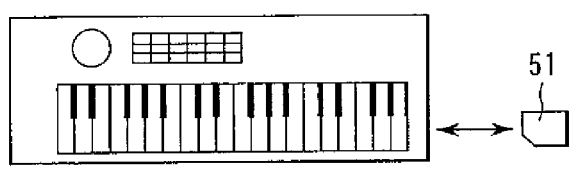
Figure 23F:
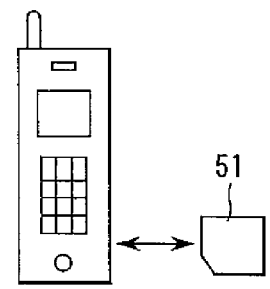
Figure 23G:
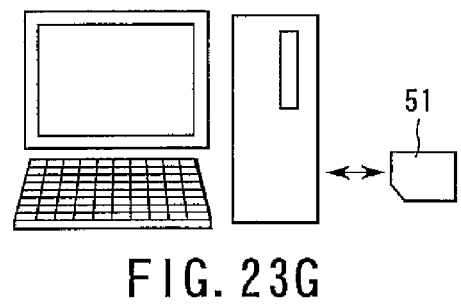
Figure 23H:
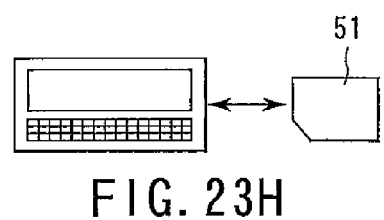
Figure 23I:
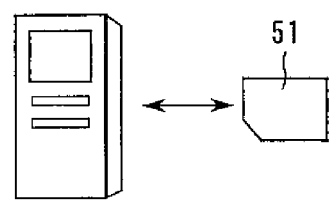
Figure 23J:
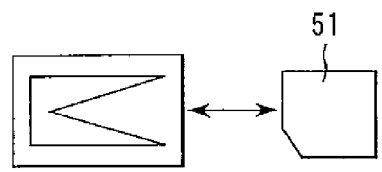

As described above, the electronic card using the semiconductor integrated circuit described in the above first to tenth embodiments is applicable to portable electronic apparatuses, for example, digital still camera. Of course, the electronic card is also applicable to the following application examples shown in FIG. 23A to FIG. 23J, in addition to the digital still camera. The application examples include video cameras (FIG. 23A), televisions (FIG. 23B), audio apparatuses (FIG. 23C), game apparatuses (23D), electronic musical instruments (FIG. 23E), mobile phones (FIG. 23F), personal computers (FIG. 23G), personal digital assistants (PDA) (FIG. 23H), voice recorders (FIG. 23I), PC cards (FIG. 23J), etc.

The present invention has been described above based on the first to eleventh embodiments. The present invention is not limited to the above embodiments, and various modifications may be made in carrying out without departing from the sprit and scope of the invention.

In the above embodiment, the substrate 3 has the two-layer wiring structure comprising the land plane pattern 23 and the bonding plane pattern 27. For example, the substrate 3 may of course have a three-layer or more wiring structure.

The above embodiment has described the so-called wire bonding type semiconductor device, which connects the internal terminal 11 of the substrate 3 and the bonding pad of the IC chip 5 by the bonding wire 13.

Figure 24:
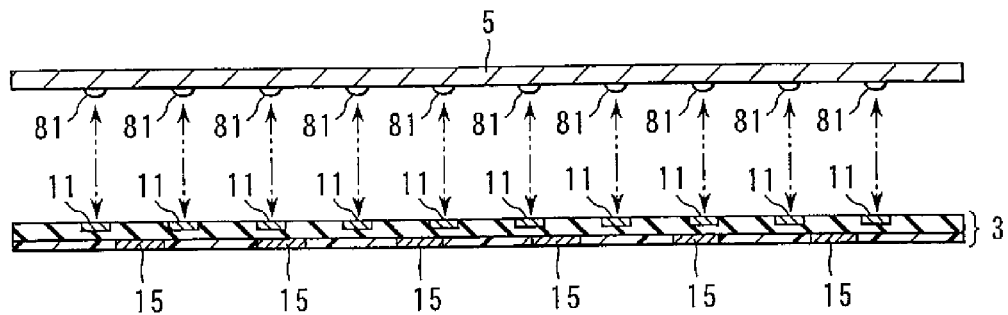
FIG. 24 is a sectional view showing another semiconductor package capable of applying the above first to tenth embodiments of the present invention.
Figure 25A:
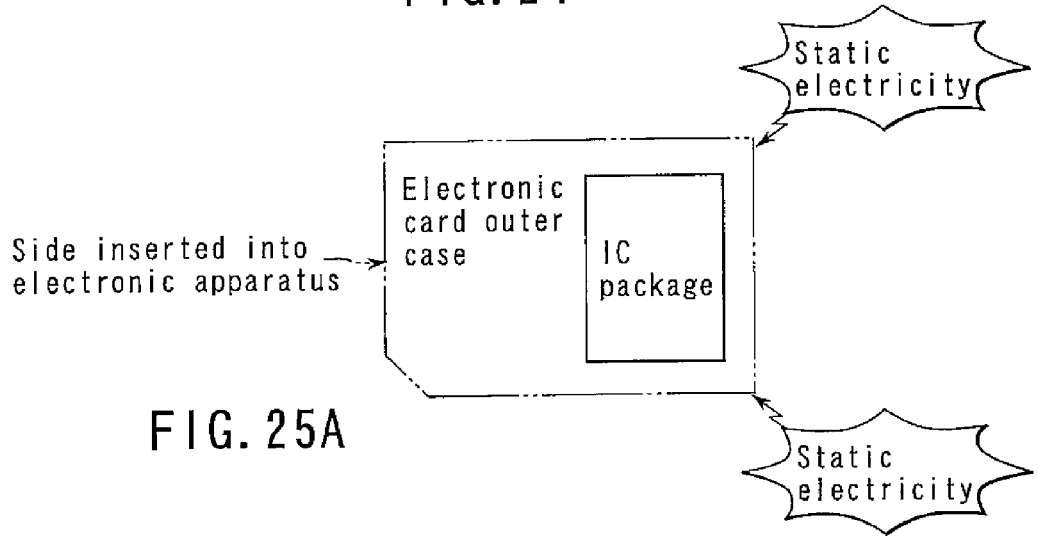
FIG. 25A and FIG. 25B are views to explain the background of the present invention.
Figure 25B:
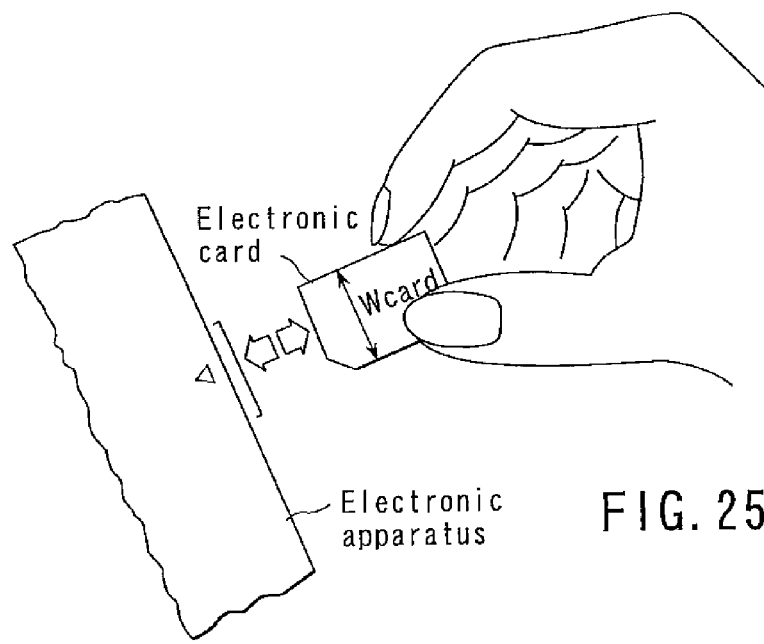

However, the present invention is not limited to only wire bonding type semiconductor device described above. For example, the present invention is applicable to a so-called flip chip type semiconductor device, which connects the internal terminal 11 of the substrate 3 with a bump electrode 81 of the IC chip 5, as shown in FIG. 24.

The above embodiment has described the case where the dielectric sealing material 7 seals the IC chip 5. The dielectric sealing material 7 is dielectric plastic; in this case, for example, dielectric ceramics are usable.

The present invention is applicable to so-called bare chip mounting, which does not seal the IC chip 5 by the dielectric sealing material 7. The above bare chip mounting is frequently employed in the flip chip type semiconductor device.

In the above embodiment, the non-volatile semiconductor memory device has been used as the semiconductor device mounted onto the electronic card. In the present invention, the semiconductor device mounted onto the electronic card is not limited to the non-volatile semiconductor memory device.

The above embodiments may be independently carried out, and may be of course carried out based on a suitable combination of each embodiment.

The above embodiments include various stepwise inventions. Thus, constituent features disclosed in each embodiment are properly combined, and thereby, it is possible to extract various stepwise inventions.

Even if the semiconductor device described in the above embodiment is not only mounted onto the electronic card but also mounted onto electronic apparatuses, e.g., mobile electronic apparatuses, the same effect as above can be obtained. Because, the development of miniaturization and high-density mounting is now making in the mobile electronic apparatuses; for this reason, it is required to take steps described in the present specification.

As is evident from the above description, according to the embodiments of the present invention, it is possible to provide a semiconductor device, which can improve electrostatic breakdown resistance, an electronic card mounted with the semiconductor device. Further, it is possible to provide a pad rearrangement substrate, which is one of the semiconductor device components, and applications using the above electronic card mounted with the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electric card comprising:
   a semiconductor chip;
   a dielectric substrate including a first plane mounted with the semiconductor chip and a second plane opposite to the first plan;
   an external terminal provided on the second plane of the dielectric substrate, the external terminal electrically being connected to the semiconductor chip via a through hole;
   a dummy pattern provided at an outer end portion of the second plane of the dielectric substrate and configured to be grounded; and
   a case holding a dielectric substrate.

2. The electric card according to claim 1, wherein the dielectric substrate includes a rectangular shape and the dummy pattern is provided between one corner portion of the dielectric substrate and the other corner portion thereof, which is adjacent to the one corner portion.

3. The electric card according to claim 1, wherein the dummy pattern includes a rectangular shape and the dummy pattern is provided at a corner portion of the dielectric substrate.

4. The electric card according to claim 1, wherein the dummy pattern includes a straight line shape.

5. The electric card according to claim 1, wherein the dummy pattern includes an end portion provided at an edge of the dielectric substrate.

6. An electric card comprising:
   a semiconductor chip;
   a dielectric substrate including a bonding plane mounted with the semiconductor chip and a land plane opposite to the bonding plane;
   a first terminal provided on the bonding plane and electrically connected to the semiconductor chip via a bonding wire;
   wiring pattern provided on the land plane and electrically connected to the first terminal via a through hole;
   a second terminal provided on the land plane of the dielectric substrate, the second terminal being electrically connected to the wiring pattern;
   a dummy pattern provided at an outer end portion of the land plane of the dielectric substrate and configured to be grounded; and
   a case holding a dielectric substrate.

7. The electric card according to claim 6, wherein the dielectric substrate includes a rectangular shape and the dummy pattern is provided between one corner portion of the dielectric substrate and the other corner portion thereof, which is adjacent to the one corner portion.

8. The electric card according to claim 6, wherein the dielectric substrate includes a rectangular shape and the dummy pattern is provided at a corner portion of the dielectric substrate.

9. The electric card according to claim 6, wherein the dummy pattern includes a straight line shape.

10. The electric card according to claim 6, wherein the dummy pattern includes an end portion provided at an edge of the dielectric substrate.

* * * * *